United States Patent
Kawakami et al.

(10) Patent No.: US 10,466,591 B2
(45) Date of Patent: Nov. 5, 2019

(54) FLUORINE-CONTAINING COMPOSITION, SUBSTRATE FOR PATTERN FORMATION, PHOTODEGRADABLE COUPLING AGENT, PATTERN FORMATION METHOD AND TRANSISTOR PRODUCTION METHOD

(71) Applicant: NIKON CORPORATION, Tokyo (JP)

(72) Inventors: Yusuke Kawakami, Yokohama (JP); Kazuo Yamaguchi, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 22 days.

(21) Appl. No.: 15/629,222

(22) Filed: Jun. 21, 2017

(65) Prior Publication Data

US 2017/0285471 A1 Oct. 5, 2017

Related U.S. Application Data

(63) Continuation of application No. PCT/JP2016/055456, filed on Feb. 24, 2016.

(30) Foreign Application Priority Data

Feb. 25, 2015 (JP) ................................ 2015-035424
Feb. 16, 2016 (JP) ................................ 2016-027241

(51) Int. Cl.
| | | |
|---|---|---|
| G03F 7/11 | (2006.01) | |
| G03F 7/075 | (2006.01) | |
| B05D 3/10 | (2006.01) | |
| G03F 7/004 | (2006.01) | |
| G03F 7/16 | (2006.01) | |
| G03F 7/20 | (2006.01) | |
| H01L 51/00 | (2006.01) | |
| G03F 7/40 | (2006.01) | |

(52) U.S. Cl.
CPC ............... *G03F 7/11* (2013.01); *B05D 3/10* (2013.01); *G03F 7/0046* (2013.01); *G03F 7/0751* (2013.01); *G03F 7/0755* (2013.01); *G03F 7/16* (2013.01); *G03F 7/2002* (2013.01); *H01L 51/0004* (2013.01); *G03F 7/40* (2013.01)

(58) Field of Classification Search
CPC .......................................................... G03F 7/11
USPC ...................................................... 430/271.1
See application file for complete search history.

(56) References Cited

U.S. PATENT DOCUMENTS

2005/0266327 A1\* 12/2005 Toriyama ............. G03G 5/0605
430/58.35

FOREIGN PATENT DOCUMENTS

| JP | 2003321479 | \* 11/2003 | ............... C07F 7/18 |
| JP | 2008-50321 | 3/2008 | |

OTHER PUBLICATIONS

International Search Report dated Apr. 26, 2016 in corresponding International Patent Application No. PCT/JP2016/055456.
Written Opinion of the International Searching Authority dated Apr. 26, 2016 in corresponding International Patent Application No. PCT/JP2016/055456.

\* cited by examiner

*Primary Examiner* — John S Chu

(57) ABSTRACT

Disclosed is a fluorine-containing composition containing a fluorine-containing compound represented by general formula (1) and a fluorine-based solvent.

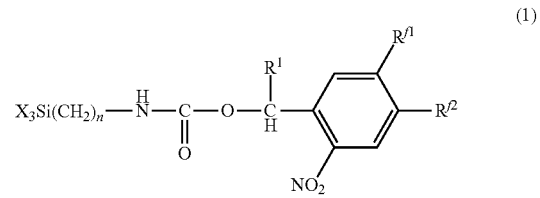

9 Claims, 3 Drawing Sheets

FLUORINE-CONTAINING COMPOSITION, SUBSTRATE FOR PATTERN FORMATION, PHOTODEGRADABLE COUPLING AGENT, PATTERN FORMATION METHOD AND TRANSISTOR PRODUCTION METHOD

CROSS-REFERENCE TO RELATED APPLICATION

This is a Continuation application of International Patent Application No. PCT/JP2016/055456 filed on Feb. 24, 2016, which claims priority on Japanese Patent Application No. 2015-035424 filed on Feb. 25, 2015, and Japanese Patent Application No. 2016-027241 filed on Feb. 16, 2016. The contents of the aforementioned applications are incorporated herein by reference.

BACKGROUND OF THE INVENTION

Technical Field

The present invention relates to a fluorine-containing composition, a substrate for pattern formation, a photodegradable coupling agent, a pattern formation method and a transistor production method.

The present application claims priority based on Japanese Patent Application No. 2015-035424 filed in Japan on Feb. 25, 2015 and on Japanese Patent Application No. 2016-027241 filed in Japan on Feb. 16, 2016, the contents of which are incorporated herein by reference.

Description of the Related Art

Methods have been recently proposed for the production of semiconductor elements, integrated circuits or organic EL display devices that comprises producing microdevices utilizing differences in surface characteristics by forming patterns having different surface characteristics on a substrate using organic thin films composed of organic compounds.

A known example of an organic thin film composed of an organic compound is a so-called self-assembled monolayer (SAM) in which a monomolecular film composed of highly ordered organic molecules is formed by self-assembly by utilizing interactions between the substrate surface on which the thin film is formed and molecules of the organic compound.

Self-assembled monolayers refer to monomolecular films in which organic molecules are used that have as a terminal group thereof a functional group that forms a prescribed chemical bond with a prescribed substrate, thereby allowing chemical bonds to be formed with the surface of the substrate resulting in an orderly arrangement due to regulation of anchored organic molecules from the substrate surface and interaction among the organic molecules. These self-assembled monolayers can be easily deposited on a substrate due to their simple production method.

On the other hand, when depositing an organic semiconductor film, electrical characteristics of the organic transistor produced can be improved by controlling wettability and lipophilicity of the substrate surface, and organic thin films in the manner of self-assembled monolayers are considered to be able to be used to modify substrate surfaces in this manner.

An example of a pattern formation method that utilizes differences in the surface characteristics of substrates consists of forming a hydrophilic region and lipophilic region on a substrate and applying an aqueous solution of a functional material onto the hydrophilic region. This method allows the formation of thin film patterns of functional materials since the aqueous solution of the functional material only spreads out over the hydrophilic region.

Patent Document 1 discloses that a hydrophilic region and lipophilic region can be formed on a substrate by making a considerable change in the contact angle before and after irradiating with light by modifying the surface by forming a self-assembled monolayer on the substrate using a photodegradable silane coupling agent.

PATENT DOCUMENTS

Patent Document 1: Japanese Unexamined Patent Application, First Publication No. 2008-50321

SUMMARY OF THE INVENTION

An organic thin film like a self-assembled monolayer is effective for modifying the surface of a substance. Although the photodegradable silane coupling agent disclosed in Patent Document 1 is able to contribute to modification of the surface of a substrate by inducing a considerable change in the contact angle before and after irradiating with light, it still has room for improvement with respect to improving the characteristics of the organic thin film formed.

With the foregoing in view, an object of the present invention is to provide a fluorine-containing composition able to be preferably used in the formation of an organic thin film having favorable characteristics, a substrate for pattern formation that uses this fluorine-containing composition, a photodegradable coupling agent and a pattern formation method.

A first aspect of the present invention is a fluorine-containing composition comprising a fluorine-containing compound represented by the following general formula (1) and a fluorine-based solvent:

[Chemical Formula 1]

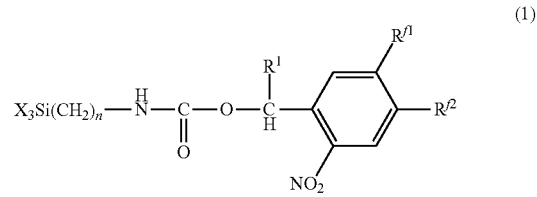

(wherein,

X represents a halogen atom or alkoxy group, $R^1$ represents a hydrogen atom or linear, branched or cyclic alkyl group having 1 to 10 carbon atoms, $R^{f1}$ and $R^{f2}$ respectively and independently represent a fluorinated alkoxy group, and n represents an integer of 0 or more).

A second aspect of the present invention is a substrate for pattern formation having a surface that has been chemically modified using the aforementioned fluorine-containing composition of the first aspect.

A third aspect of the present invention is a photodegradable coupling agent composed of the aforementioned fluorine-containing composition of the first aspect.

A fourth aspect of the present invention is a pattern formation method for forming a pattern on a treated surface of a target material, comprising: chemically modifying the treated surface using the aforementioned fluorine-containing composition of the first aspect, forming a latent image consisting of a hydrophilic region and a water-repellent region by exposing the chemically modified treated surface to light, and arranging a pattern forming material in the aforementioned hydrophilic region or water-repellent region.

A fifth aspect of the present invention is a pattern formation method for forming a circuit pattern for an electronic device on a flexible substrate, comprising: chemically modifying an entire surface of the substrate or a specific region thereof using the aforementioned fluorine-containing composition of the first aspect, forming a latent image of the circuit pattern on the substrate utilizing a difference in hydrophilicity and water repellency of the surface of the substrate by exposing the surface of the chemically modified substrate to light, and contacting a liquid pattern forming material with the portion of the latent image on the surface of the substrate, thereby capturing the pattern forming material in the shape of the circuit pattern by utilizing the difference in hydrophilicity and water repellency.

A sixth aspect of the present invention is a pattern formation method for forming a circuit pattern for an electronic device on a prescribed substrate, comprising: forming a fluorine-containing composition layer by applying the fluorine-containing composition of the aforementioned first aspect of the present invention to the substrate, forming a latent image of the circuit pattern on the substrate by utilizing a difference in hydrophilicity and water repellency by exposing the fluorine-containing composition layer formed on the substrate to light of a prescribed pattern, and carrying out electro-less plating by contacting an electro-less plating catalyst with a portion of the latent image.

In the aforementioned pattern formation method of the fourth or fifth aspect of the present invention, the pattern forming material preferably contains a liquid electrically conductive material, liquid semiconductor material or liquid insulating material.

In the fourth to sixth aspects of the present invention, the light radiated during exposure to light preferably comprises light contained in the wavelength region of 200 nm to 450 nm.

A seventh aspect of the present invention is a transistor production method for producing a transistor comprising a gate electrode, a source electrode and a drain electrode, the method comprising: forming at least one electrode of the gate electrode, the source electrode and the drain electrode with the aforementioned pattern formation method of any of the fourth to sixth aspects of the present invention.

DETAILED DESCRIPTION OF THE PREFERRED EMBODIMENTS

<<Fluorine-Containing Composition>>

Figure 1:
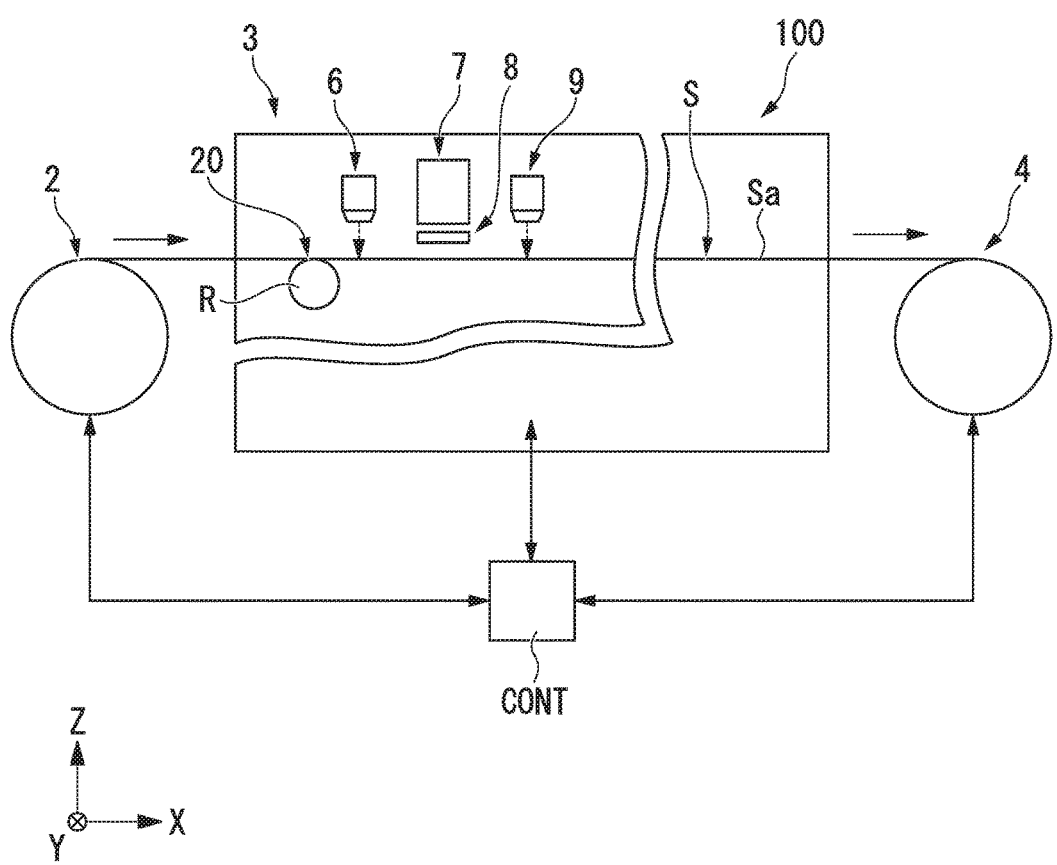
FIG. 1 is a schematic diagram showing the entire configuration of a substrate processing device preferably used in the pattern formation method of an aspect of the present invention.

A first aspect of the present invention is a fluorine-containing composition comprising a fluorine-containing compound represented by general formula (1) and a fluorine-based solvent.

The following provides an explanation of the fluorine-containing compound contained in the fluorine-containing composition of an aspect of the present invention.

<Fluorine-Containing Compound>

In this aspect of the present invention, the fluorine-containing compound is represented by the following general formula (1):

[Chemical Formula 2]

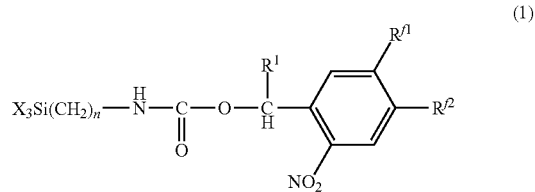

(wherein,

X represents a halogen atom or alkoxy group, $R^1$ represents a hydrogen atom or linear, branched or cyclic alkyl group having 1 to 10 carbon atoms, $R^{f1}$ and $R^{f2}$ respectively and independently represent a fluorinated alkoxy group, and n represents an integer of 0 or more).

In the aforementioned general formula (1), X represents a hydrogen atom or alkoxy group. Although examples of halogen atoms represented by X include a fluorine atom, chlorine atom, bromine atom and iodine atom, X is more preferably an alkoxy group rather than a halogen atom. n represents an integer, and from the viewpoint of availability of the starting raw material, n is preferably an integer of 1 to 20 and more preferably an integer of 2 to 15.

In the aforementioned general formula (1), $R^1$ represents a hydrogen atom or linear, branched or cyclic alkyl group having 1 to 10 carbon atoms.

The alkyl group of $R^1$ is preferably a linear or branched alkyl group having 1 to 5 carbon atoms, and specific examples thereof include a methyl group, ethyl group, propyl group, isopropyl group, n-butyl group, isobutyl group, tert-butyl group, pentyl group, isopentyl group and neopentyl group.

Examples of cyclic alkyl groups include groups in which one or more hydrogen atoms have been removed from a polycycloalkane such as a monocycloalkane, bicycloalkane, tricycloalkane and tetracycloalkane.

In an aspect of the present invention, $R^1$ is preferably a hydrogen atom, methyl group, ethyl group or isopropyl group, and more preferably a methyl group or isopropyl group.

In the aforementioned general formula (1), $R^{f1}$ and $R^{f2}$ respectively and independently represent a fluorinated alkoxy group.

The fluorinated alkoxy group of $R^{f1}$ and $R^{f2}$ in the aforementioned general formula (1) is preferably a partially fluorinated alkoxy group having 3 or more carbon atoms or a perfluoroalkoxy group. In an aspect of the present invention, the fluorinated alkoxy group is preferably a fluorinated alkoxy group that is partially fluorinated.

In as aspect of the present invention, examples of fluorinated alkoxy groups represented by $R^{f1}$ and $R^{f2}$ include groups represented by $-O-(CH_2)_{n^{f1}}-(C_{n^{f2}}F_{2n^{f2}+1})$. The aforementioned $n^{f1}$ is an integer of 0 or more and $n^{f2}$ is an integer of 0 or more. Although the fluorinated alkoxy groups of $R^{f1}$ and $R^{f2}$ may be the same or different, they are preferably the same from the viewpoint of ease of synthesis.

In an aspect of the present invention, the fluorinated alkoxy groups represented by $R^{f1}$ and $R^{f2}$ are preferably long-chain fluoroalkyl groups.

In an aspect of the present invention, $n^{f1}$ is preferably 0 to 10, more preferably 0 to 5, particularly preferably 0 to 3 and extremely preferably 3.

In addition, in an aspect of the present invention, $n^{f2}$ is preferably 1 to 15, more preferably 4 to 15, particularly preferably 6 to 12 and extremely preferably 7 to 10.

In an aspect of the present invention, $n^{f2}$ is preferably an even number from the viewpoints of material availability and ease of synthesis.

In addition, if $n^{f2}$ is equal to or greater than the aforementioned lower limit value, water repellency of an organic thin film formed using the fluorine-containing composition of an aspect of the present invention can be maintained.

Moreover, if $n^{f2}$ is equal to or lower than the aforementioned upper limit value, coatability of a metal ink or other pattern forming material can be made to be favorable while maintaining water repellency of an organic thin film formed using the fluorine-containing composition of an aspect of the present invention.

In the aforementioned general formula (1), n represents an integer of 0 or more. In an aspect of the present invention, n is preferably 3 or more. In addition, n is preferably 10 or less and more preferably 5 or less.

The aforementioned upper limit values and lower limit value can be arbitrarily combined.

The following indicates specific examples of the fluorine-containing compound represented by general formula (1).

[Chemical Formula 3]

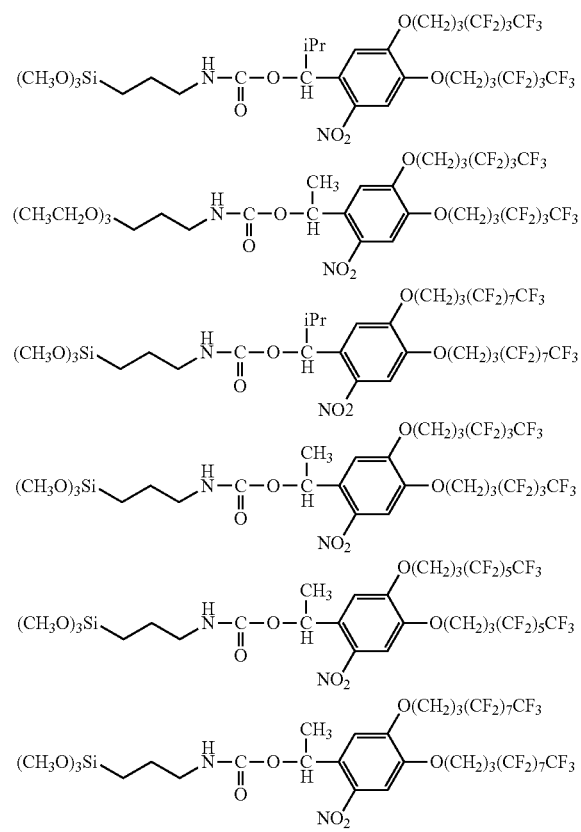

[Method for Producing Fluorine-Containing Compound]

The fluorine-containing compound can be obtained by going through, for example, the following first to fifth steps. Furthermore, the following indicates an example in which $R^{f1}$ and $R^{f2}$ are the same.

[Chemical Formula 4]

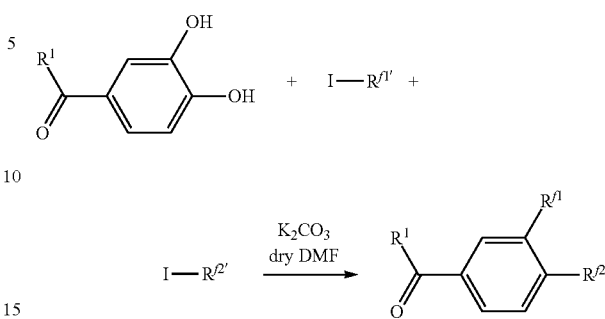

First Step

In the above formula, $R^1$, $R^{f1}$ and $R^{f2}$ are the same as $R^1$, $R^{f1}$ and $R^{f2}$ in the aforementioned general formula (1), and $R^{f1'}$ and $R^{f2'}$ represent fluorinated alkyl groups.

[Chemical Formula 5]

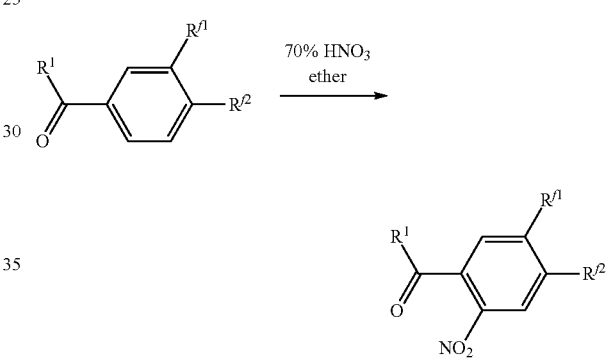

Second Step

In the above formula, $R^1$, $R^{f1}$ and $R^{f2}$ are the same as $R^1$, $R^{f1}$ and $R^{f2}$ in the aforementioned general formula (1).

[Chemical Formula 6]

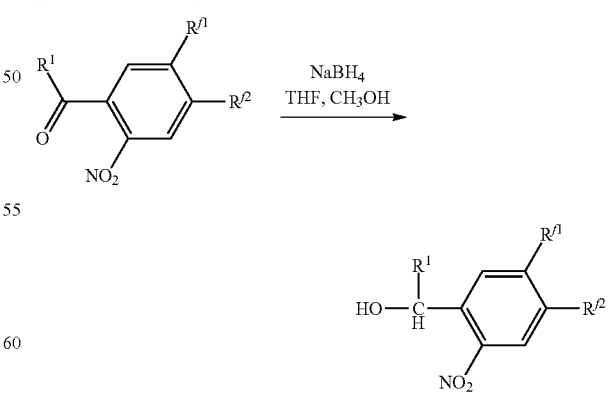

Third Step

In the above formula, $R^1$, $R^{f1}$ and $R^{f2}$ are the same as $R^1$, $R^{f1}$ and $R^{f2}$ in the aforementioned general formula (1).

[Chemical Formula 7]

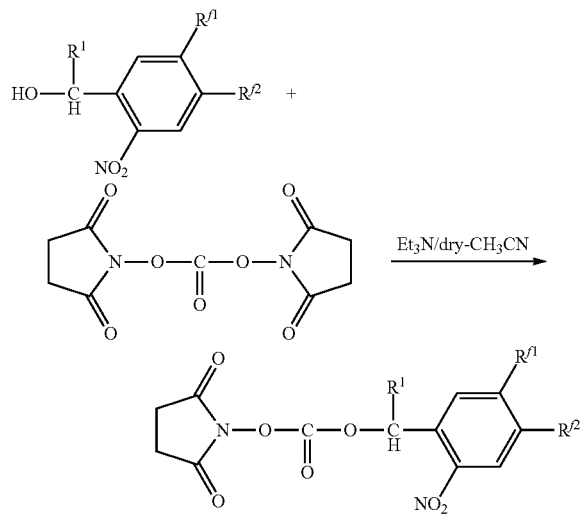

Fourth Step

In the above formula, R¹, R^{f1} and R^{f2} are the same as R¹, R^{f1} and R^{f2} in the aforementioned general formula (1).

In the following formulas, the explanations of X, R¹, R^{f1}, R^{f2} and n are the same as the explanations of R¹, R^{f1}, R^{f2} and n in the aforementioned general formula (1).

[Chemical Formula 8]

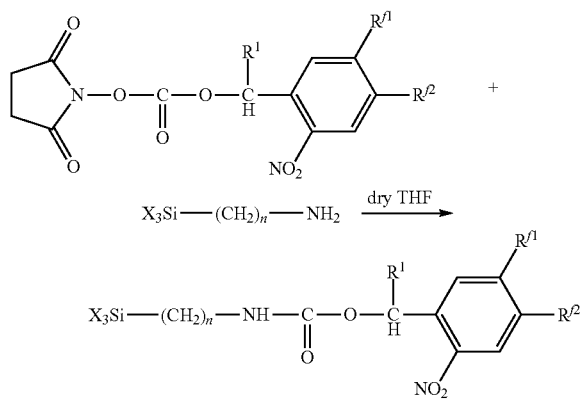

Fifth Step

In the above formula, the explanations of X, R¹, R^{f1}, R^{f2} and n are the same as the explanations of R¹, R^{f1}, R^{f2} and n in the aforementioned general formula (1).

<Fluorine-Based Solvent>

The fluorine-containing composition of an aspect of the present invention comprises a fluorine-based solvent having a fluorine atom in a molecule thereof.

Examples of fluorine-based solvents in an aspect of the present invention include hexafluoro-m-xylene (HFX), hydrochlorofluorocarbons (HCFC), hydrofluorocarbons (HFC), perfluorocarbons (PFC); ether-based hydrofluoroethers (HFE), perfluoropolyether (PFPE), and hydrofluoroether (HFPE); 1,3-bistrifluoromethylbenzene, 1,1,2,2,3,4,5,5,5-decafluoropentane, 1,1,2,2,3,3,4-heptafluorocyclopentane, and 1,4-bistrifluoromethylbenzene. These solvents may be used alone or two or more types may be used as a mixture.

Among these, hexafluoro-m-xylene (HFX) is preferable.

As a result of containing a fluorine-based solvent, the fluorine-containing composition of an aspect of the present invention allows the formation of a smooth film when forming an organic thin film since the fluorinated alkoxy groups present in the fluorine-containing compound uniformly decompose without aggregating in the solvent.

The aforementioned fluorine-containing compound may be used alone or two or more types may be used in combination in the fluorine-containing composition of an aspect of the present invention.

In addition, the concentration of the fluorine-containing compound in the fluorine-containing composition of an aspect of the present invention as the molar concentration (M) thereof is preferably 0.05 mM to 1.0 mM, more preferably 0.075 mM to 0.5 mM, and particularly preferably 0.085 mM to 0.2 mM.

In addition, the fluorine-containing composition of an aspect of the present invention may also incorporate commonly known additives such as stabilizers (such as an ultraviolet absorber, antioxidant or thermal polymerization inhibitor) or surfactants (such as a leveling agent, antifoaming agent, suspending agent or dispersant) within a range that does not impair the effects of the present invention.

<<Substrate for Pattern Formation>>

A second aspect of the present invention is a substrate for pattern formation having a surface chemically modified using the aforementioned fluorine-containing composition.

The surface of the substrate for pattern formation of an aspect of the present invention is modified using the aforementioned fluorine-containing composition. Consequently, a hydrophilic region is formed on an exposed portion of the substrate for pattern formation while a water repellent region is formed on the non-exposed portion as a result of selectively exposing the substrate through a mask and the like.

By applying a pattern forming material to the substrate having a hydrophilic region and water repellent region formed thereon, the pattern forming material can be selectively applied to the hydrophilic region formed on an exposed portion thereof, thereby allowing the formation of metal wiring and the like.

There are no particular limitations on the base material, and preferable examples thereof include glass, quartz glass, silicon wafers, plastic plates and metal plates. In addition, a substrate may also be used that has a metal thin film on these substrates.

There are no particular limitations on the shape of the base material and preferable examples thereof include a flat surface, curved surface and partially curved surface, with a flat surface being preferable. In addition, there are also no particular limitations on the surface area of the base material, and a base material can be used having a surface area of a size to which a conventional application method can be applied. In addition, the surface that is chemically modified using the aforementioned fluorine-containing composition is preferably formed on one side of a flat base material.

When modifying the surface of a substrate, the substrate surface is preferably subjected to pretreatment. Pretreatment with piranha solution or pretreatment with UV ozone cleaner is preferable for the aforementioned treatment method.

There are no particular limitations on the method used to modify the substrate surface provided it is a method in which X bound to reactive Si in the aforementioned general formula (1) is bound to the substrate, and a known method such as immersion or chemical treatment can be used.

<<Photodegradable Coupling Agent>>

A third aspect of the present invention is a photodegradable coupling agent comprising the aforementioned fluorine-containing composition.

The photodegradable coupling agent of an aspect of the present invention is provided with a photodegradable group provided with a liquid repellent group and an anchoring group X linked to this photodegradable group through a functional group, the liquid repellent group has fluorinated alkoxy chains $R^{f1}$ and $R^{f2}$ on the terminals thereof, and the functional group leaves an amino group as a residue thereof following photodegradation. Consequently, the photodegradable coupling agent of an aspect of the present invention is able to ensure a large difference in contact angle before and after irradiating with light.

<<Pattern Formation Method>>

A fourth aspect of the present invention is a pattern formation method for forming a pattern on a treated surface of a target material, comprising: chemically modifying the treated surface using the aforementioned fluorine-containing composition of the first aspect, forming a latent image consisting of a hydrophilic region and a water repellent region by exposing the chemically modified treated surface to light, and arranging a pattern forming material in the aforementioned hydrophilic region or water-repellent region.

In this aspect of the present invention, a treated surface of a target material is chemically modified using the aforementioned fluorine-containing composition of the first aspect in a pattern formation method for forming a pattern on the treated surface.

There are no particular limitations on the target material. Examples of target materials in an aspect of the present invention include metals, crystalline materials (such as single crystal materials, polycrystalline materials or partially crystalline materials), amorphous materials, conductors, semiconductors, insulators, optical elements, coated substrates, fibers, glass, ceramics, zeolite, plastics, and thermosetting and thermoplastic resins (such as doped polyacrylate, polycarbonate, polyurethane, polystyrene, cellulose polymer, polyolefin, polyamide, polyimide, resin, polyester or polyphenylene, which are optionally doped), films, thin films and foils.

In the pattern formation method of an aspect of the present invention, a circuit pattern for an electronic device is preferably formed on a flexible substrate.

In an aspect of the present invention, a resin film or stainless steel or other foil, for example, can be used for the flexible substrate serving as a target material. Examples of materials that can be used for the resin film include polyethylene resin, polypropylene resin, polyester resin, ethylene-vinyl copolymer resin, polyvinyl chloride resin, cellulose resin, polyamide resin, polyimide resin, polycarbonate resin, polystyrene resin and vinyl acetate resin.

Here, flexibility refers to a property that allows a substrate to bend when subjected to a force roughly equal to its own weight without disconnecting or breaking. In addition, the property of being able to be curved by a force roughly equal to its own weight is also included in the concept of flexibility. In addition, the aforementioned flexibility varies according to such factors as the material, size and weight of the substrate as well as environmental factors such as temperature. Furthermore, although a single band-shaped substrate may be used for the substrate, a configuration may also be employed in which a plurality of individual substrates are connected in the form of a band.

In the above-described chemical modification, the aforementioned fluorine-containing composition is preferably used to chemically modify the entire treated surface of the target material or a specific region thereof.

There are no particular limitations on the method used to chemically modify the treated surface of the target material provided it is a method in which X bound to a reactive Si in the aforementioned general formula (1) is bound to the substrate, and a known method such as immersion or chemical treatment can be used.

The following indicates an example of the chemical modification.

The chemical modification can be carried out by, for example, reacting the fluorine-containing compound represented by the aforementioned general formula (1) with a substrate having hydroxyl groups as indicated below.

In the following formula, the explanations of X, $R^1$, $R^{f1}$, $R^{f2}$ and n are the same as the explanations of X, $R^1$, $R^{f1}$, $R^{f2}$ and n in the aforementioned general formula (1).

[Chemical Formula 9]

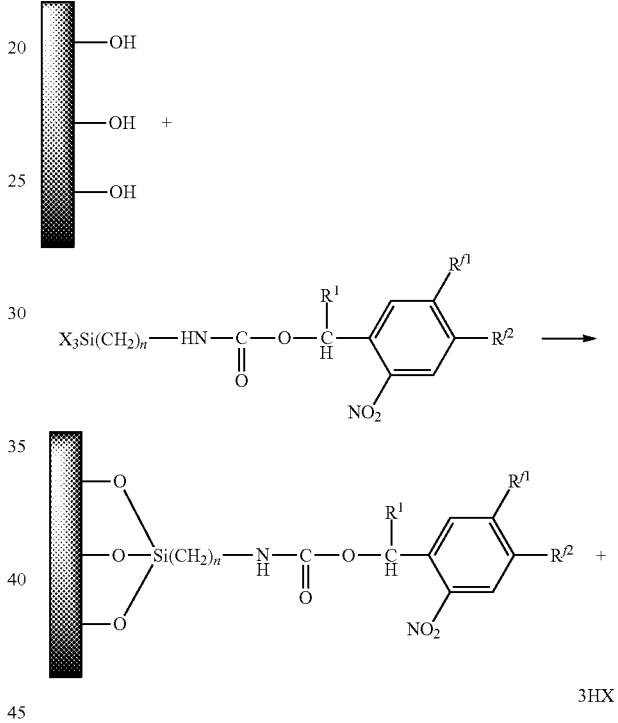

In addition, the chemical modification may also be carried out by producing a substrate having amino groups and reacting with an active carbonate having a 2-nitrobenzyl group as indicated below.

In the following formula, the explanations of $R^1$, $R^{f1}$, $R^{f2}$ and n are the same as the explanations of $R^1$, $R^{f1}$, $R^{f2}$ and n in the aforementioned general formula (1).

[Chemical Formula 10]

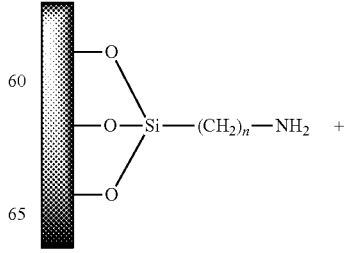

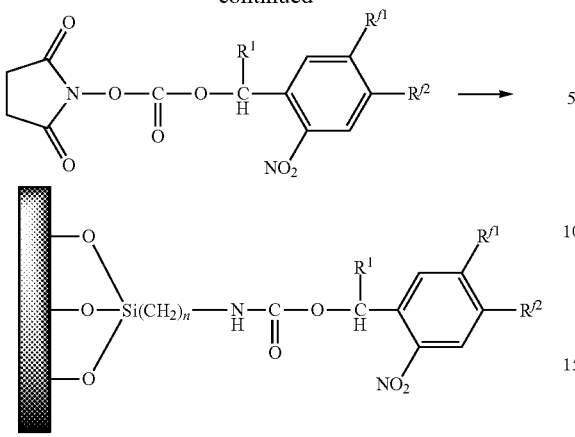

Next, a latent image consisting of a hydrophilic region and a water-repellent region is formed by exposing the chemically modified treated surface to light.

The light radiated during exposure is preferably ultraviolet light. The radiated light preferably contains light having a wavelength contained within the range of 200 nm to 450 nm, and more preferably contains light having a wavelength contained within the range of 320 nm to 450 nm. In addition, the radiated light is preferably light having a wavelength of 365 nm. Light of these wavelengths is able to efficiently decompose the photodegradable group of an aspect of the present invention. Examples of light sources include a low-pressure mercury lamp, high-pressure mercury lamp, ultra-high-pressure mercury lamp, xenon lamp, sodium lamp, nitrogen or other gas laser, liquid lasers employing an organic dye solution, and solid-state lasers containing rare earth ions in an organic single crystal.

In addition, light having a specific wavelength obtained by extracting a wide-band line spectrum or continuous spectrum using an optical filter such as a bandpass filter or cutoff filter may also be used as a light source other than a laser that allows the obtaining of monochromatic light. A high-pressure mercury lamp or ultra-high-pressure mercury lamp is preferable for the light source since it is capable of irradiating a large surface area all at once.

Although light is arbitrarily radiated over the aforementioned range in the pattern formation method of an aspect of the present invention, it is preferable to radiate light energy having a distribution corresponding to a circuit pattern in particular.

In the formation of the latent image, since a residue (amino group) with hydrophilicity is formed due to the elimination of a group having water repellency as a result of irradiating the chemically modified treated surface with light of a prescribed pattern, a latent image consisting of a hydrophilic region and a water repellent region can be formed following exposure to light.

Here, a latent image of a circuit pattern is preferably formed on a flexible substrate by utilizing a difference in hydrophilicity and water repellency.

The following indicates an example of an operation for eliminating a group having water repellency to form a residue (amino group) with hydrophilicity by irradiating a chemically modified treated surface with light of a prescribed pattern. In the following formula, the explanations of $R^1$, $R^{f1}$, $R^{f2}$ and n are the same as the explanations of $R^1$, $R^{f1}$, $R^{f2}$ and n in the aforementioned general formula (1).

[Chemical Formula 11]

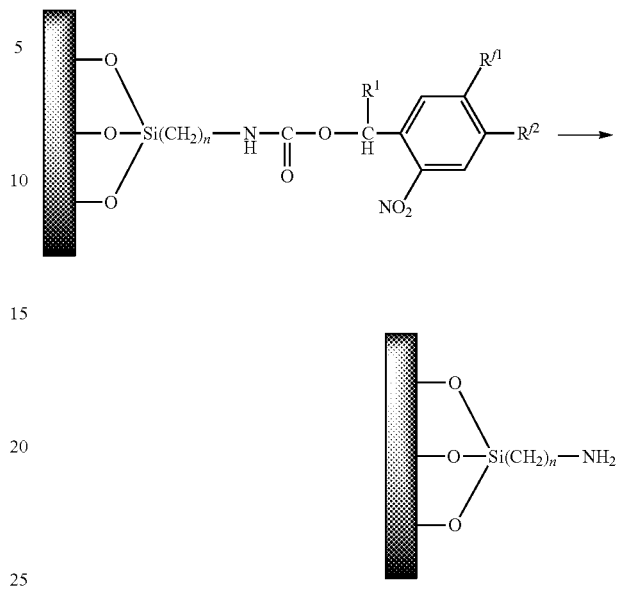

<Two-Stage Surface Conversion>

In the forming of a latent image consisting of a hydrophilic region and a water repellent region by irradiating a chemically modified treated surface with light of a prescribed pattern using the fluorine-containing composition of an aspect of the present invention, the latent image consisting of a hydrophilic region and water repellent region may be formed by a two-stage surface conversion method.

The two-stage surface conversion method consists of first carrying out surface modification on a substrate surface using the fluorine-containing composition of an aspect of the present invention to make the substrate surface water repellent as indicated in the "First Stage" indicated below. Subsequently, the substrate surface is irradiated with light to form groups with hydrophilicity (amino groups) and convert the water repellent substrate to a hydrophilic substrate.

Moreover, as indicated in the second stage below, the substrate surface converted to a hydrophilic surface in the first stage can be converted to a water repellent surface by allowing an active carbonate or active ester to act on the substrate which has been converted to a hydrophilic substrate in the first stage.

[Chemical Formula 12]

First Stage

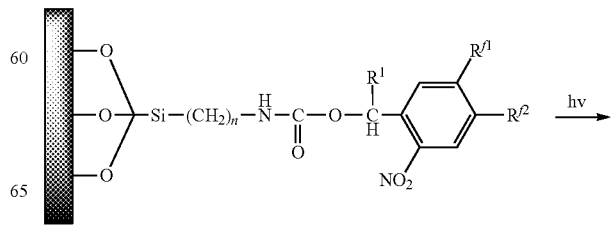

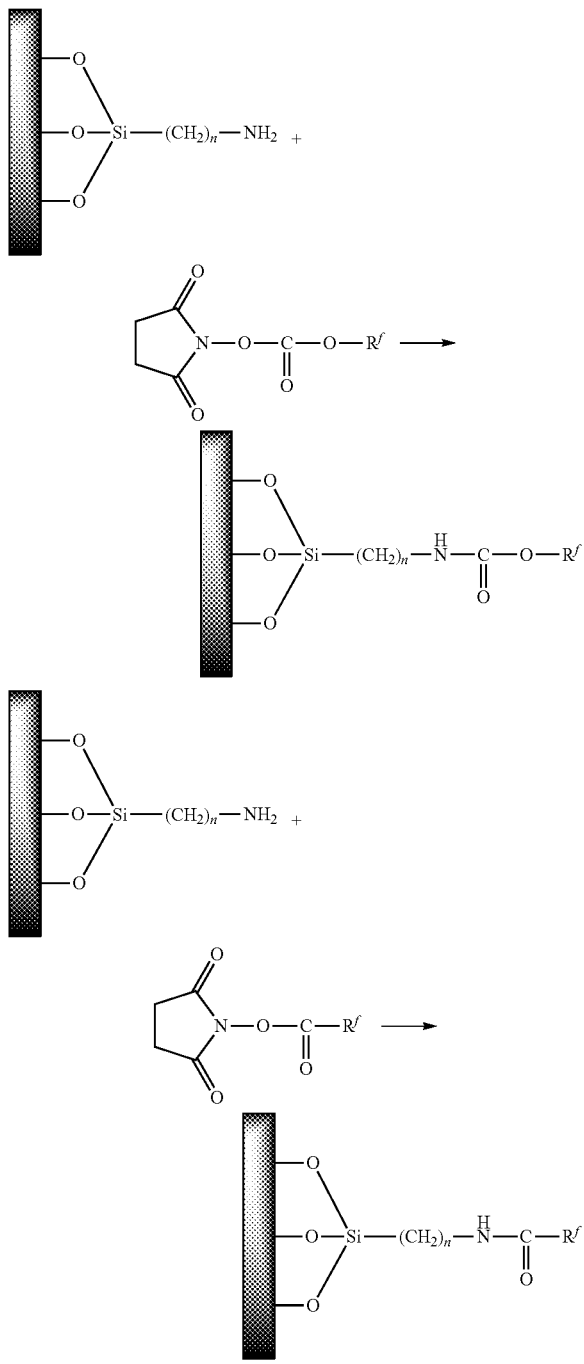

In the reaction formulas indicated in the aforementioned "First Stage" and "Second Stage", the explanations of $R^1$, $R^{f1}$, $R^{f2}$ and n are the same as the explanations of $R^1$, $R^{f1}$, $R^{f2}$ and n in the aforementioned general formula (1).

In addition, $R^f$ represents a fluorinated alkyl group.

Next, a pattern forming material is arranged in the hydrophilic region or water repellent region that had been formed.

Examples of pattern forming materials include wiring materials obtained by dispersing particles of gold, silver, copper or an alloy thereof in a prescribed solvent (metal solution), and electronic material or resist solutions obtained by dispersing a precursor solution containing the aforementioned metals, insulator (resin), semiconductor or organic EL luminescent material in a prescribed solvent.

The pattern forming material in the pattern formation method of an aspect of the present invention is preferably a liquid electrically conductive material, liquid semiconductor material or liquid insulating material.

Examples of liquid electrically conductive materials include pattern forming materials composed of a dispersion obtained by dispersing electrical conductive fine particles in a dispersion medium. Examples of electrically conductive fine particles used include metal fine particles containing any of gold, silver, copper, palladium, nickel or ITO, fine particles of oxides thereof, as well as fine particles of electrically conductive polymers and superconductors. These electrically conductive fine particles can also be used by coating organic substances and the like on a surface in order to improve dispersibility.

There are no particular limitations on the dispersion medium provided it is able to disperse the aforementioned electrically conductive fine particles and not cause aggregation. Examples thereof include water, alcohols such as methanol, ethanol, propanol or butanol, hydrocarbon-based compounds such as n-heptane, n-octane, decane, dodecane, tetradecane, toluene, xylene, cymene, durene, indene, dipentene, tetrahydronaphthalene, decahydronaphthalene or cyclohexylbenzene, ether-based compounds such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis(2-methoxyethyl)ether or p-dioxane, and polar compounds such as propylene carbonate, γ-butyrolactone, N-methyl-2-pyrrolidone, dimethylformamide, dimethylsulfoxide and cyclohexanone. Among these, water, alcohols, hydrocarbon-based compounds and ether-based compounds are preferable from the viewpoints of fine particle dispersibility, dispersion stability and ease of application to liquid droplet discharge methods (inkjet methods), while more preferable examples of dispersion media include water and hydrocarbon-based compounds.

Organic semiconductor materials dispersed or dissolved in a dispersion medium can be used as a liquid semiconductor material. Organic semiconductor materials are preferably π-electron conjugated low molecular weight materials or polymeric materials in which the skeleton thereof is composed of conjugated double bonds. Typical examples thereof include soluble low molecular weight materials, including acenes such as pentacene and thienoacenes such as benzothienobenzothiophene, and soluble polymeric materials such as polythiophene, poly(3-alkylthiophene) or polythiophene derivatives. In addition, soluble precursor materials that are transformed into the aforementioned semiconductors by heat treatment may also be used, and examples thereof include pentacene precursors such as sulfinylacetamide pentacene.

Examples of liquid insulating materials include insulating materials obtained by dispersing or dissolving polyimide, polyamide, polyester, acryl, phosphosilicate glass (PSG), borophosphosilicate glass (BPSG), polysilane-based spin-on glass (SOG), silicate-based SOG, alkoxysilicate-based SOG or $SiO_2$ having Si—$CH_3$ bonds represented by siloxane polymers, in a dispersion medium.

Here, a liquid droplet discharge method, inkjet method, spin coating method, roll coating method or slot coating method and the like can be applied for the method used to arrange the pattern forming material.

The following provides an explanation of a pattern formation method of an aspect of the present invention with reference to the drawings.

In the pattern formation method of an aspect of the present invention, patterns may be formed using a roll-to-roll device in the form of a substrate processing device 100 as shown in FIG. 1 in the case of using a flexible substrate compatible with a so-called roll-to-roll process. FIG. 1 indicates the configuration of the substrate processing device 100.

As shown in FIG. 1, the substrate processing device 100 has a substrate supply unit 2 that supplies a band-shaped substrate S (such as a band-shaped film member), a substrate processing unit 3 that carries out processing on a surface (treated surface) of the substrate S, a substrate recovery unit 4 that recovers the substrate S, an application unit 6 that applies a fluorine-containing composition, a light exposure unit 7, a mask 8, a pattern material application unit 9, and control unit CONT that controls each of these components. The substrate processing unit 3 is able to carry out each type of processing on the surface of the substrate S from the time the substrate S is sent out from the substrate supply unit 2 until the substrate S is recovered by the substrate recovery unit 4.

This substrate processing device 100 can be preferably used in the case of forming, for example, an organic EL element, liquid crystal display element or other display element (electronic device) on the substrate S.

Furthermore, although FIG. 1 illustrates a system that uses a photomask to form light of a desired pattern, a mask-less exposure system that does not use a photomask can also be preferably used in an aspect of the present invention. Examples of mask-less exposure systems that form a pattern of light without using a photomask include methods using a spatial light modulation element such as a DMD and methods consisting of scanning with a spotlight in the manner of a laser beam printer.

The following provides an explanation of the pattern formation method of an aspect of the present invention using a suitable XYZ coordinate system by setting the XYZ coordinates as shown in FIG. 1. In the XYZ coordinate system, the X and Y axes are set along the horizontal plane, for example, while the Z axis is set facing upwards along the vertical direction. In addition, the substrate processing device 100 conveys the substrate S along the entire X axis from its negative side (−side) to its positive side (+side). At that time, the direction of width (short direction) of the band-shaped substrate S is set in the direction of the Y axis.

A plastic film or stainless steel foil, for example, can be used for the substrate S targeted for processing in the substrate processing device 100. For example, a material such as polyethylene resin, polypropylene resin, polyester resin, ethylene-vinyl copolymer resin, polyvinyl chloride resin, cellulose resin, polyamide resin, polyimide resin, polycarbonate resin, polystyrene resin or vinyl acetate resin can be used for the resin film.

The substrate preferably has a small coefficient of thermal expansion so that the dimensions thereof do not change even if subjected to heat of about 200° C., for example. For example, the coefficient of thermal expansion can be lowered by mixing inorganic filler into the resin film. Examples of inorganic fillers include titanium oxide, zinc oxide, alumina and silicon oxide. In addition, the substrate S may also be in the form of a piece of ultra-thin glass having a thickness of about 100 μm produced according to the float glass method or a laminate obtained by laminating the aforementioned resin film or aluminum foil on the ultra-thin glass.

The substrate S is formed so that the dimension in the direction of width (short direction) is, for example, about 1 m to 2 m, and the dimension in the direction of length (long direction) is, for example, 10 m or more. Naturally, these dimensions are only intended to be exemplary, and the dimensions of the substrate S are not limited thereto. For example, the dimension of the substrate S in the Y direction may be 50 cm or less or 2 m or more. In addition, the dimension of the substrate S in the X direction may be 10 m or less.

The substrate S is preferably formed so as to have flexibility. Here, flexibility refers to a property that allows a substrate to bend when subjected to a force roughly equal to its own weight without disconnecting or breaking. In addition, the property of being able to be curved by a force roughly equal to its own weight is also included in the concept of flexibility. In addition, the aforementioned flexibility varies according to such factors as the material, size and thickness of the substrate as well as environmental factors such as temperature. Furthermore, although a single band-shaped substrate may be used for the substrate S, a configuration may also be employed in which a plurality of individual substrates are connected in the form of a band.

The substrate supply unit 2 sends out the substrate S wound around a roller and supplies it to the substrate processing unit 3. In this case, the substrate supply unit 2 is provided with a shaft that winds up the substrate S and a rotational driving device that rotates the shaft. In addition, a configuration may also be employed in which a cover is provided that covers the substrate S when wound in the form of a roll. Furthermore, the substrate supply unit 2 is not limited to a configuration in which the substrate S is sent out after having been wound in the form of a roll, but rather may also include a mechanism that sequentially feeds out the band-shaped substrate S in the lengthwise direction thereof (such as nip driving roller).

The substrate recovery unit 4 recovers the substrate S that has passed through the substrate processing device 100 by winding into the form of a roll. The substrate recovery unit 4 is provided with, for example, a shaft for winding up the substrate S, a rotational drive source that rotates the shaft, or a cover that covers the recovered substrate S in the same manner as the substrate supply unit 2. Furthermore, in the case the substrate S is cut into the shape of panels, for example, in the substrate processing unit 3, a configuration may be employed in which the substrate S is recovered in a different state from the state in which it is recovered in the form of a roll, such as by recovering the substrate S in a stacked state.

The substrate processing unit 3 conveys the substrate S supplied from the substrate supply unit 2 to the substrate recovery unit 4, and performs: chemically modifying the treated surface Sa of the substrate S using a fluorine-containing composition, irradiating the chemically modified treated surface with light of a prescribed pattern, and arranging the pattern forming material during the course of conveyance. The substrate processing unit 3 comprises the fluorine-containing composition application unit 6 that applies the fluorine-containing composition to the treated surface Sa of the substrate S, the exposure unit 7 that radiates light, the mask 8, the pattern material application unit 9, and a conveyance device 20 that comprises a drive roller R that sends the substrate S according to conditions corresponding to the form of the processing treatment.

An example of the fluorine-containing composition application unit 6 and the pattern material application unit 9 includes a liquid droplet application device (such as a liquid droplet discharge-type application device, inkjet-type application device, spin coating-type application device, roll coating-type application device or slot coating-type application device).

Each of these devices is suitably provided along the conveyance path of the substrate S, enabling flexible display panels and the like to be produced by a so-called roll-to-roll process. The exposure unit 7 is provided in the present embodiment, and devices responsible for operations before and after exposure (such as a photosensitive layer formation or photosensitive layer development operation) are provided inline as necessary.

Since the fluorine-containing compound contained in a fluorine-containing composition of an aspect of the present invention has a photodegradable group having a water-repellent group having fluorinated alkoxy groups on the terminals thereof, it is possible to increase contact angle in the case of anchoring to the surface of a base material. In addition, since groups having water repellency can be dissociated by irradiating with light resulting in the formation of residues (amino groups) having hydrophilic performance, favorable hydrophilic performance is demonstrated after irradiating with light, thereby making it possible to decrease the contact angle.

The fluorine-containing composition of the present invention can be preferably used in an organic thin film layer (also referred to as "self-assembled monolayer") to be used for producing organic thin film transistors, for example.

A self-assembled monolayer improves wettability of an organic semiconductor material, making it possible to improve the crystallinity (in terms of crystal size and crystal orientation) of the organic semiconductor material. Moreover, since the fluorine-containing composition of the present invention contains a fluorine-based solvent, the fluorine-containing compound can be uniformly dispersed in the solvent without aggregating, thereby making it possible to form a smooth self-assembled monolayer. Consequently, electrical connections between an organic semiconductor layer and the source electrode and drain electrode that constitute an organic thin film transistor can be improved.

For example, the coatability of an organic semiconductor material can be improved by altering wettability by irradiating with light by forming a self-assembled monolayer on an insulating surface that constitute an organic thin film transistor using the fluorine-containing composition of the present invention, thereby enabling the formation of a smooth self-assembled monolayer, and this is thought to make it possible to contribute to improvement of organic semiconductor mobility.

<Electra-Less Plating Pattern Formation>

According to the fluorine-containing composition of an aspect of the present invention, an electro-less plating pattern can be formed by, for example, the following method. The following provides an explanation thereof using FIG. 2.

Figure 2:
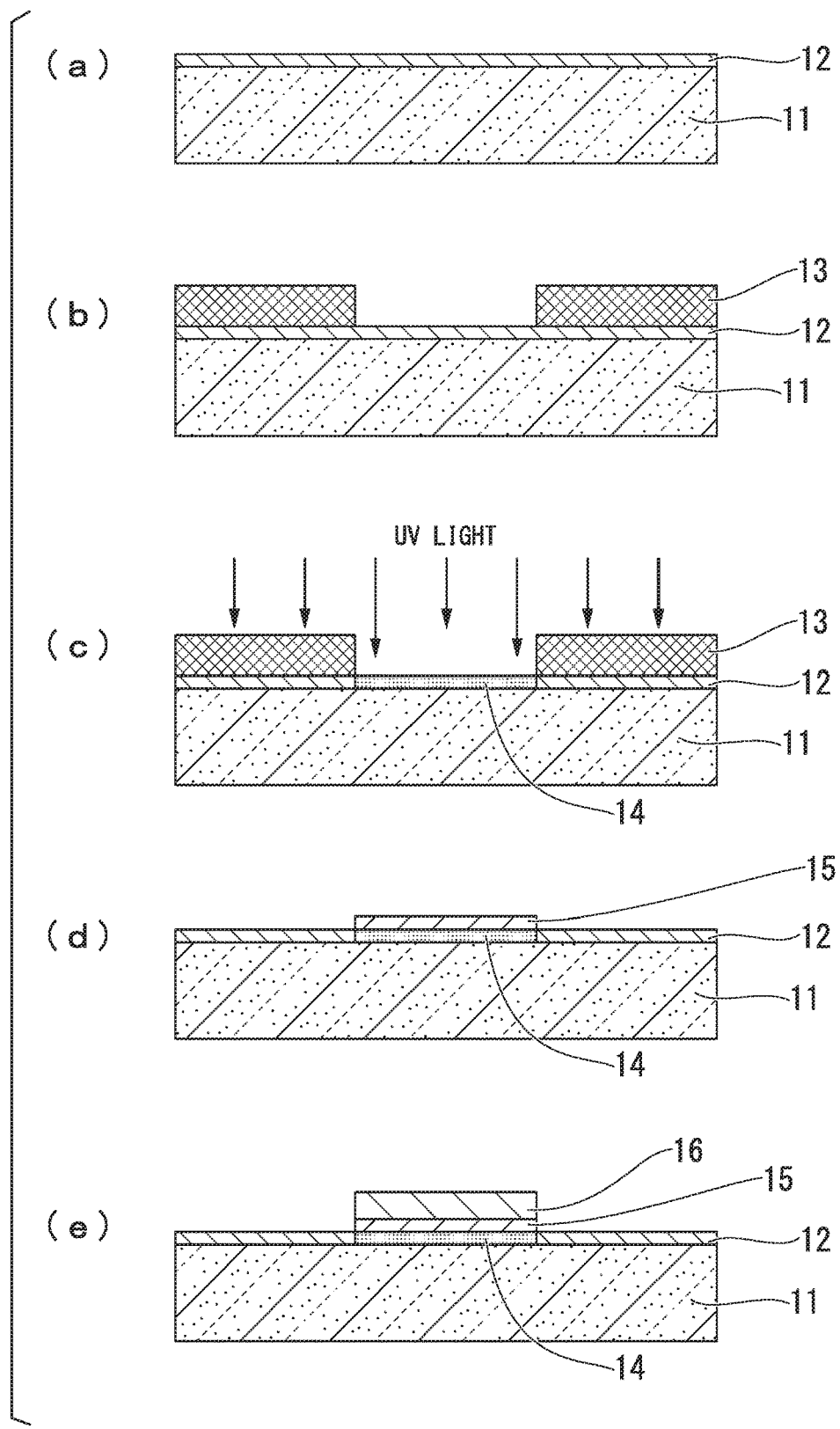
FIG. 2 is a drawing showing an example of a general process chart of the pattern formation method of an aspect of the present invention.

First, a fluorine-containing composition layer 12 is deposited on the surface of a substrate 11 by applying the fluorine-containing composition of an aspect of the present invention as shown in FIG. 2(*a*).

Physical vapor deposition method (PVD), chemical vapor deposition method (CVD), liquid phase growth method or any general deposition technology may be used for the application method. Among these, liquid phase growth method is particularly preferable, and examples of liquid phase growth methods include coating methods (such as spin coating, dip coating, die coating, spray coating, roll coating or brush coating), and printing methods (such as flexographic printing or screen printing). In addition, an SAM film or LB film may be used.

Furthermore, in the present operation, treatment may also be added in which the solvent is dried by heat or reduced pressure, for example.

Next, as shown in FIG. 2(*b*), a photomask 13 is prepared that has an exposure region having a prescribed pattern. The exposure method is not limited to means using a photomask, but rather a projection exposure means using optics such as lenses and mirrors or a mask-less exposure means using a spatial light modulation element or laser beam, for example, can be used. Furthermore, the photomask 13 may be provided so as to contact the fluorine-containing composition layer 12 or may be provided without making contact.

Subsequently, as shown in FIG. 2(*c*), the fluorine-containing composition layer 12 is irradiated with UV light through the photomask 13. As a result, the fluorine-containing composition layer 12 is exposed in the exposure region of the photomask 13 and a layer 14 having amino groups is formed. Furthermore, in the present operation, exposure may be carried out using a liquid such as toluene, acetone or alcohol. Due to exposure by use of a liquid such as toluene, acetone or alcohol, de-protecting groups and other impurities generated by exposure to light can be preferably removed. Since de-protecting groups and other impurities impair exposure, exposure by use of a liquid makes it possible to shorten exposure time.

Furthermore, UV light can be radiated at a wavelength at which optimum quantum efficiency is demonstrated according to the structure of photosensitive groups. An example thereof is i-line exposure at a wavelength of 365 nm. In addition, the amount of exposure and duration of exposure are not required to allow de-protection to proceed completely, but rather are only required to a degree that allows the formation of a portion of the amino groups. At that time, conditions (such as activity of the plating bath) can be suitably altered corresponding to the degree of progression of de-protection in the plating operation to be subsequently described.

Next, an electro-less plating catalyst is imparted to the surface to form a catalyst layer 15 as shown in FIG. 2(*d*). The electro-less plating catalyst is a catalyst that reduces metal ions contained in the plating liquid used for electro-less plating, and examples thereof include silver and palladium.

Amino groups are able to capture and reduce the aforementioned electro-less plating catalyst. Consequently, the electro-less plating catalyst is captured only on the layer 14 having amino groups resulting in the formation of the catalyst layer 15. In addition, an electro-less catalyst that is capable of supporting amino groups can be used.

Electro-less plating treatment is then carried out to form a plating layer 16 as shown in FIG. 2(*e*). Furthermore, examples of the material of the plating layer 16 include nickel phosphorous (NiP) and copper (Cu).

In the present operation, the substrate 11 is immersed in an electro-less plating bath to reduce metal ions on the catalyst surface and precipitate the plating layer 16. At this time, since the catalyst layer 15 is formed on the surface of the layer 14 having amino groups that is capable of supporting an adequate amount of catalyst, the plating layer 16 can be selectively precipitated only on the layer 14 having amino groups. In the case reduction is inadequate, metal ions on the amine may be selectively reduced by immersing in a reducing agent solution such as a solution of sodium hypophosphite or sodium borohydride.

As a result of carrying out the aforementioned operation, an electro-less plating pattern can be formed on a prescribed substrate using the fluorine-containing composition of an aspect of the present invention.

<Transistor Production Method>

Figure 3:
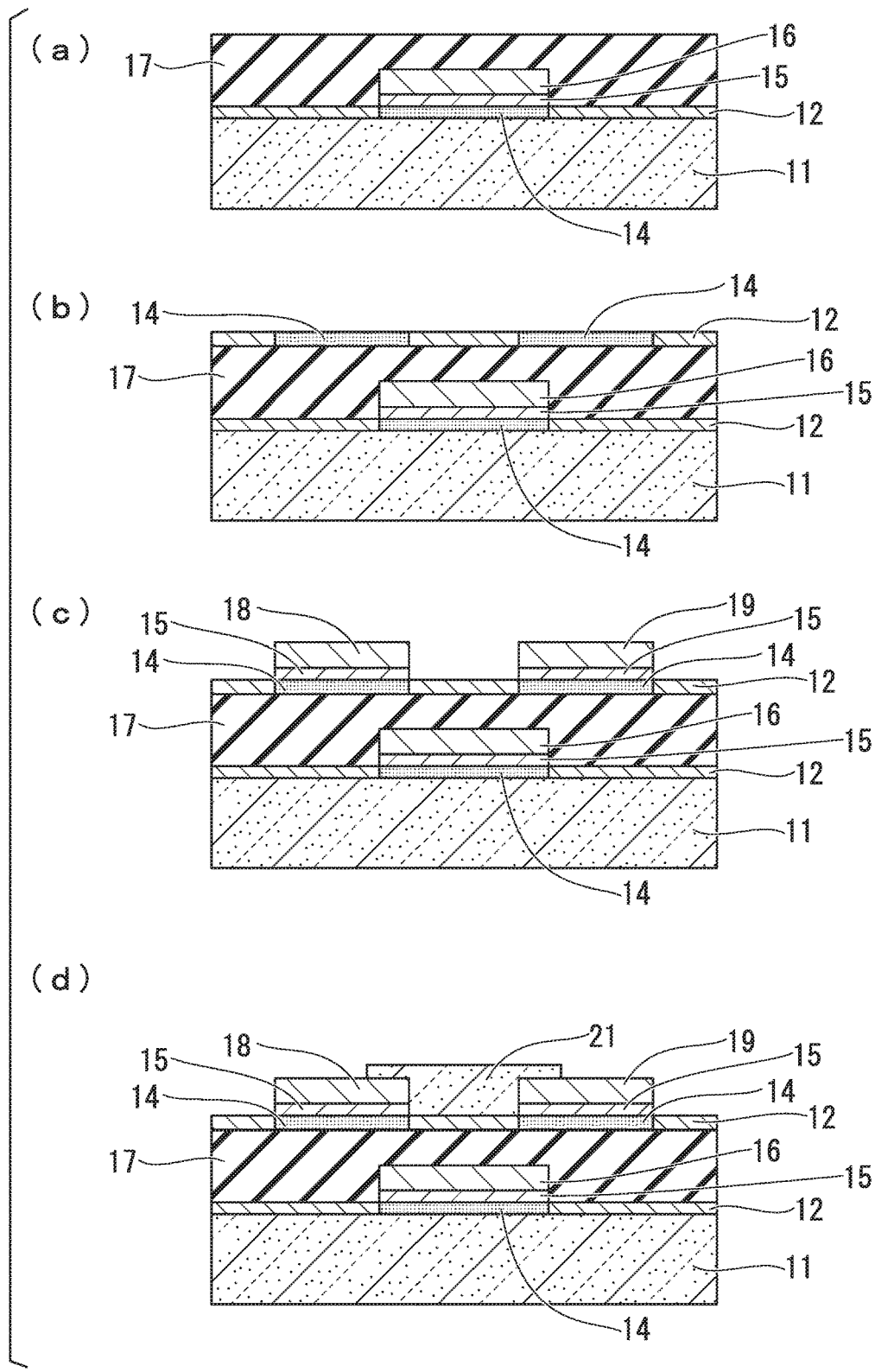
FIG. 3 is a drawing showing an example of a general process chart of the transistor production method of an aspect of the present invention.

Moreover, an explanation using FIG. 3 is provided of a method for producing a transistor in which the plating layer 16 obtained in the above operation is used for the gate electrode.

As shown in FIG. 3(a), the plating layer 16 of the electro-less plating pattern formed according to the aforementioned electro-less plating pattern formation method is covered according to a known method to form an insulator layer 17 on the fluorine-containing composition layer 12. The insulator layer 17 may be formed by applying a coating solution using a coating solution obtained by dissolving one or more resins such as an ultraviolet-curable acrylic resin, epoxy resin, ene-thiol resin or silicone resin in an organic solvent. The insulator layer 17 can then be formed in a desired pattern by irradiating the coated film with ultraviolet light though a mask provided with an opening corresponding to the region where the insulator layer 17 is formed.

As shown in FIG. 3(b), the layer 14 having amino groups is formed on the portions where the source electrode and drain electrode are formed in the same manner as the previous operations of the aforementioned electro-less plating pattern formation method.

As shown in FIG. 3(c), after having formed the catalyst layer 15 by supporting an electro-less plating catalyst on the layer 14 having amino groups in the same manner as the previous operations of the aforementioned electro-less plating pattern formation method, a plating layer 18 (source electrode) and a plating layer 19 (drain electrode) are formed by carrying out electro-less plating. Furthermore, although examples of the materials of the plating layer 18 and the plating layer 19 include nickel phosphorous (NiP) and copper (Cu), these layers may be formed with materials that differ from that of the plating layer 16 (gate electrode).

As shown in FIG. 3(d), a semiconductor layer 21 is formed between the plating layer 18 (source electrode) and the plating layer 19 (drain electrode). The semiconductor layer 21 may be formed by, for example, preparing a solution obtained by dissolving an organic semiconductor material that is soluble in organic solvent, such as TIPS pentacene (6,13-bis(triisopropylsilylethynyl)pentacene), in the organic solvent followed by applying the solution between the plating layer 18 (source electrode) and the plating layer 19 (drain electrode) and drying. Furthermore, the fluorine-containing composition layer 12 between the plating layer 18 (source electrode) and the plating layer 19 (drain electrode) may be exposed and hydrophilized prior to forming the semiconductor layer 21. As a result of hydrophilizing the portion corresponding to the transistor channel, the aforementioned solution is preferably applied to the hydrophilized portion thereby facilitating selective formation of the semiconductor layer 21. In addition, the semiconductor layer 21 may also be formed by adding one or more types of an insulating polymer such as polystyrene (PS) or polymethyl methacrylate (PMMA) to the aforementioned solution and then applying the solution containing the insulating polymer and drying. When the semiconductor layer 21 is formed in this manner, an insulating polymer is concentrated and formed beneath the semiconductor layer 21 (on the side of the insulating layer 17). Although transistor characteristics tend to decrease in the case amino groups or other polar groups are present at the interface between the organic semiconductor and insulator layer, as a result of employing a configuration in which the organic semiconductor is provided with the aforementioned insulating polymer, decreases in transistor characteristics can be inhibited. A transistor can be produced in the manner described above.

According to the aforementioned method, a simple process can be employed for the UV exposure using only a photomask without requiring a separate chemical resist and the like. Thus, removal of a resist layer is naturally also not required. In addition, a catalyst activation treatment, which is normally required, can be omitted due to catalytic reduction of amino groups, thereby enabling high-precision patterning while realizing considerable reductions in cost as well as less time. In addition, a dip coating method can be used resulting in extremely favorable compatibility with roll-to-roll processes.

In addition, the fluorine-containing composition of an aspect of the present invention can not only be used to form plating patterns, but can also be used in the production of electrically conductive materials, polymer films and other devices. Furthermore, there are no particular limitations on transistor structure and a structure can be suitably selected corresponding to the objective. Although a method for producing a bottom-contact, bottom-gate type of transistor is explained for the aspects of FIGS. 2 and 3, a top-contact, bottom-gate type, top-contact, top-gate type or bottom-contact, top-gate type of transistor may also be produced in the same manner. Furthermore, although the aspects of FIGS. 2 and 3 are explained with respect to a method for forming all of the gate, source and drain electrodes using the fluorine-containing composition of an aspect of the present invention, only the gate electrode may be formed using the fluorine-containing composition of an aspect of the present invention, or only the source electrode and the drain electrode may be formed using the fluorine-containing composition of an aspect of the present invention.

EXAMPLES

Although the following provides a more detailed explanation of the present invention through examples thereof, the present invention is not limited to the following examples.

Synthesis Example: Synthesis of
Fluorine-Containing Compound (1)

9.02 g (65.4 mmol) of o-dimethoxybenzene, 0.311 g (2.45 mmol) of iodine crystals and 20.7 g (131 mmol) of isobutyric anhydride were placed in a 100 mL recovery flask following by refluxing for 6 hours at 170° C. and stirring for 31 hours after returning to room temperature. Subsequently, the reaction solution was distilled off under reduced pressure followed by the addition of purified water (80 mL) and extracting with diethyl ether (80 mL×3). The organic layer was washed with 5% aqueous sodium bicarbonate solution (80 mL), saturated salt solution (80 mL) and purified water (80 mL) followed by drying with anhydrous magnesium sulfate, filtering and concentrating. The resulting concentrate was then isolated and purified by column chromatography (hexane:ethyl acetate=4:1) followed by concentrating and vacuum drying to obtain 3.90 g (18.7 mmol, 29%) of a pale yellow viscous substance (Compound I1).

Identification of the compound obtained in the aforementioned synthesis (Compound (I1)) as 1-(3,4-dimethoxyphenyl)-2-methylpropanone is indicated below.

$^1$H-NMR (400 MHz, CDCl$_3$): δ1.22 (6H, d, J=6.8 Hz), 3.55 (1H, sep, J=6.8 Hz), 3.94 and 3.95 (6H, s, s), 6.90 (1H, d, J=8.4 Hz), 7.55 (1H, d, J=2.0 Hz), 7.60 (1H, d, J=2.0 Hz).

IR (NaCl): 1674 (C=O) cm$^{-1}$.

[Chemical Formula 13]

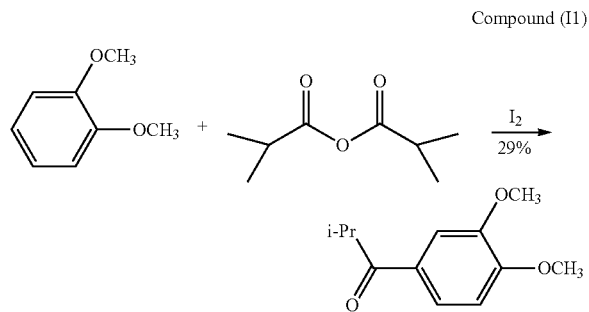

Compound (I1)

Next, 2.73 g (13.1 mmol) of Compound (I1) were placed in a 100 mL double-neck recovery flask followed by the addition of 50 mL of dry N,N-dimethylformamide solvent and 11.2 g (26.2 mmol, 20 eq) of lithium chloride in the presence of a nitrogen atmosphere. The resulting solution was refluxed for 29 hours at 170° C. followed by stirring for 32 hours at 100° C. Subsequently, 200 mL of saturated salt solution and 50 mL of 2 N hydrochloric acid were added followed by extracting with ethyl acetate (150 mL×3), drying with anhydrous magnesium sulfate, filtering, concentrating and vacuum drying. The resulting dried concentrate was then isolated and purified by column chromatography (hexane:ethyl acetate=2:1) followed by concentrating and vacuum drying to obtain 1.50 g (8.30 mmol, 63%) of a yellow viscous substance (Compound (I2)).

Identification of the compound obtained in the aforementioned synthesis (Compound (I2)) as 1-(3,4-dihydroxyphenyl)-2-methylpropanone is indicated below.

$^1$H-NMR (400 MHz, CDCl$_3$): δ1.21 (6H, d, J=6.8 Hz), 3.53 (1H, sep, J=6.9 Hz), 6.35 (1H, s), 6.94 (1H, d, J=8.4 Hz), 7.39 (1H, s), 7.52 (1H, d, J=8.4 Hz), 7.83 (1H, d, J=2.0 Hz).

IR (NaCl): 1656 (C=O), 3349 (OH) cm$^{-1}$.

[Chemical Formula 14]

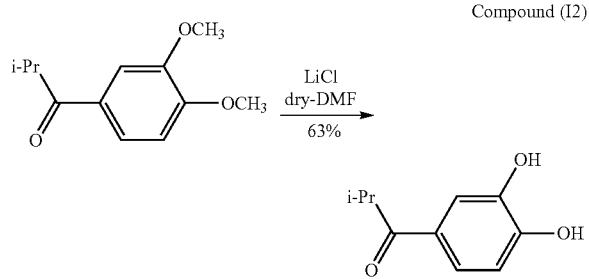

Compound (I2)

1.02 g (5.67 mmol) of Compound (I2), 15 mL of DMF and 1.57 g (11.3 mmol, 2 eq) of potassium carbonate were placed in a 100 mL double-neck recovery flask followed by stirring for 2 hours at room temperature. Subsequently, 4.64 g (12.0 mmol, 2.1 eq) of 1-iodo-1H,1H,2H,2H,3H,3H-perfluoroheptane were added to 7 mL of DMF and dropped in followed by stirring for 14 hours at 60° C. The reaction solution was distilled under reduced pressure followed by adding 60 mL of purified water and 20 mL of 2N hydrochloric acid, extracting with ethyl acetate (60 mL×4) and washing with saturated salt solution (60 mL×5). The organic layer was dried with anhydrous magnesium sulfate and then filtered, concentrated and vacuum-dried to obtain 3.62 g (5.17 mmol, 91%) of an orange solid (Compound (I3)).

Identification of the compound obtained in the aforementioned synthesis (Compound (I3)) as 1-(3,4-di(1H,1H,2H,2H,3H,3H-perfluoroheptyloxy)phenyl)-2-methylpropanone is indicated below.

$^1$H-NMR (400 MHz, CDCl$_3$): δ1.21 (6H, d, J=6.8 Hz), 2.15-2.19 (4H, m), 2.32-2.34 (4H, m), 3.53 (1H, sep, J=6.9 Hz), 4.13 and 4.14 (4H, t, t), 6.88 (1H, d, J=8.5 Hz), 7.52 (1H, d, J=2.0 Hz), 7.58 (1H, d, J=8.4 Hz).

IR (KBr): 722 (CF$_3$), 1226 (CF$_2$, CF$_3$), 1678 (C=O) cm$^{-1}$.

[Chemical Formula 15]

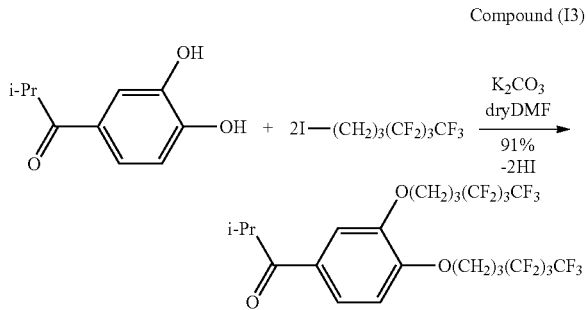

Compound (I3)

0.502 g (0.717 mmol) of Compound (I3) were placed in a 100 mL recovery flask and dissolved with 3 mL of ethyl ether followed by adding 5 mL of 70% nitric acid in small aliquots at a time in an ice bath and stirring for 1.5 hours in the ice bath. Subsequently, the reaction solution was poured onto ice and extracted with 50 mL of purified water and ethyl acetate (50 mL×3) followed by washing with 5% sodium bicarbonate (50 mL×3). The organic layer was dried with anhydrous magnesium sulfate and then filtered and concentrated. The concentrate was then dissolved with 20 mL of ethanol and recrystallized. The crystals were collected by suction filtration and vacuum-dried to obtain 0.256 g (3.43 mmol, 48%) of light yellow, needle-like crystals (Compound (I4)).

Identification of the compound obtained in the aforementioned synthesis (Compound (I4)) as 1-(2-nitro-4,5-di(1H,1H,2H,2H,3H,3H-perfluoroheptyloxy)phenyl)-2-methylpropanone is indicated below.

$^1$H-NMR (400 MHz, CDCl$_3$): δ1.21 (6H, d, J=6.8 Hz), 2.15-2.23 (4H, m), 2.27-2.34 (4H, m), 2.89 (1H, sep), 4.16 and 4.17 (4H, t, t), 6.67 (1H, s), 7.64 (1H, s).

IR (KBr): 721 (CF$_3$), 1228 (CF$_2$, CF$_3$), 1358 and 1523 (NO$_2$), 1703 (C=O) cm$^{-1}$.

[Chemical Formula 16]

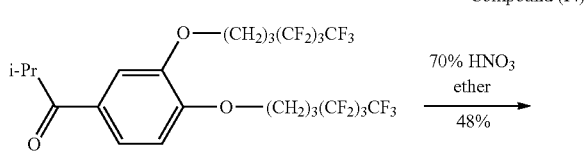

Compound (I4)

-continued

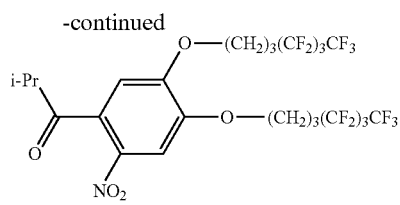

2.96 g (3.97 mmol) of Compound (I4), 12 mL of tetrahydrofuran and 8 mL of methanol were placed in a 100 mL recovery flask followed by adding 0.300 g (7.94 mmol, 2 eq) of sodium borohydride in small aliquots at a time in an ice bath followed by stirring for 90 minutes. Subsequently, the reaction solution was stirred for 30 minutes at room temperature. The reaction solution was then concentrated followed by extracting with 60 mL of purified water, 20 mL of 2 N hydrochloric acid and ethyl acetate (50 mL×3), drying the organic layer with anhydrous magnesium sulfate, filtering and concentrating. The resulting concentrate was isolated and purified by column chromatography (hexane:ethyl acetate=6:1) and then concentrated and vacuum-dried to obtain 2.17 g (2.90 mmol, 76%) of a yellow viscous substance (Compound (I5).

Identification of the compound obtained in the aforementioned synthesis (Compound (I5)) as 1-(2-nitro-4,5-di(1H,1H,2H,2H,3H,3H-perfluoroheptyloxy)phenyl)-2-methyl-propan-1-ol is indicated below.

$^1$H-NMR (400 MHz, CDCl$_3$): δ0.94 and 0.96 (6H, d, d, J=6.8 Hz), 1.97-2.03 (1H, m), 2.14-2.21 (5H, m), 2.27-2.40 (4H, m), 4.08-4.23 (4H, m), 5.27 (1H, t, J=4.8 Hz), 7.20 (1H, s), 7.55 (1H, s).

IR (NaCl): 742 (CF$_3$), 1228 (CF$_2$, CF$_3$), 1334 and 1522 (NO$_2$), 3547 (OH) cm$^{-1}$.

[Chemical Formula 17]

Compound (I5)

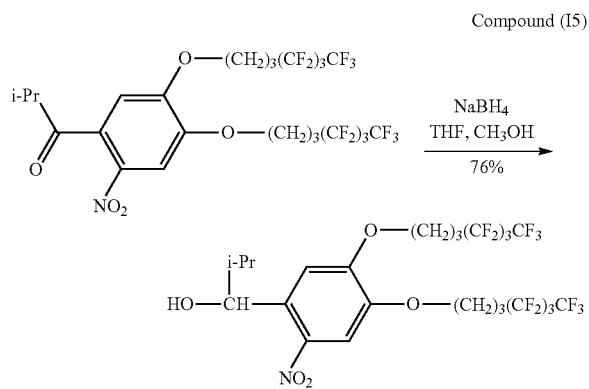

1.43 g (1.91 mmol, 1 eq) of Compound (I5), 0.580 g (5.73 mmol, 3 eq) of triethylamine, 20 mL of dry acetonitrile and 0.735 g (2.87 mmol, 1.5 eq) of N-succinimidyl carbonate were placed in a 100 mL double-neck recovery flask in the presence of a nitrogen atmosphere followed by stirring for 40 hours at room temperature. Subsequently, the reaction solution was concentrated followed by the addition of 30 mL of purified water and 5 mL of 2 N hydrochloric acid, extracting with ethyl acetate (30 mL×3) and washing with 5% salt solution (30 mL×3). The organic layer was dried with anhydrous magnesium sulfate and then filtered and concentrated. The resulting concentrate was isolated and purified by column chromatography (hexane:ethyl acetate=3:1) followed by concentration and vacuum-drying to obtain 1.55 g (1.74 mmol, 91%) of a yellow viscous substance (Compound (I6)).

Identification of the compound obtained in the aforementioned synthesis (Compound (I6)) as 1-(2-nitro-4,5-di(1H,1H,2H,2H,3H,3H-perfluoroheptoxy)phenyl)-2-methylpropyl N-succinimidyl carbonate is indicated below.

$^1$H-NMR (400 MHz, CDCl$_3$): δ1.03 and 1.11 (6H, d, d, J=7.2 Hz), 2.05-2.40 (9H, m), 2.79 (4H, s), 4.12-4.37 (4H, m), 6.38 (1H, d, J=4.8 Hz), 6.96 (1H, s), 7.65 (1H, s).

IR (NaCl): 720 (CF$_3$), 1227 (CF$_2$, CF$_3$), 1336 and 1524 (NO$_2$), 1746 (C=O) cm$^{-1}$.

[Chemical Formula 18]

Compound (I6)

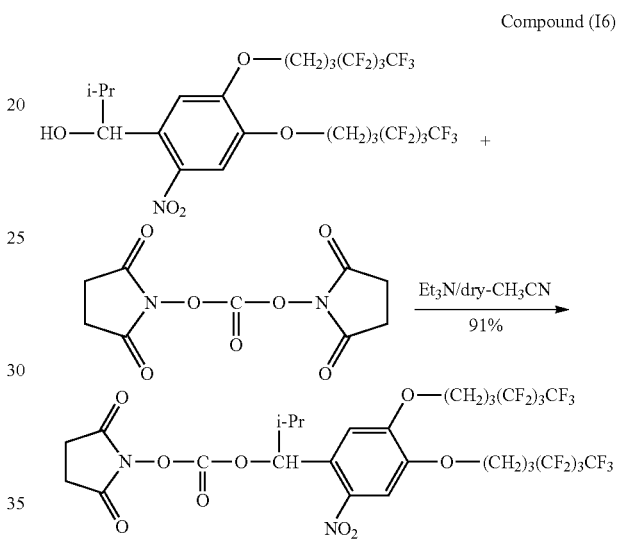

0.603 g (0.680 mmol) of Compound (I6), 10 mL of tetrahydrofuran (THF) and 0.136 g (0.759 mmol, 1.1 eq) of 3-aminopropyltrimethoxysilane were added to a 30 mL double-neck recovery flask followed by stirring for 3.5 hours at room temperature. The reaction solution was concentrated and the resulting concentrate was isolated by medium-pressure column chromatography (hexane:ethyl acetate:tetrahydrofuran=3:1:0.04) followed by concentration and vacuum-drying to obtain 0.451 g (0.473 mmol, 70%) of a pale yellow solid (Fluorine-Containing Compound (1)).

Identification of the Fluorine-Containing Compound (1) obtained in the aforementioned synthesis as 1-(2-nitro-4,5-di(1H,1H,2H,2H,3H,3H-perfluoroheptoxy)phenyl)-2-methylpropyl N-(3-trimethoxysilyl) propyl carbamate is indicated below.

$^1$H-NMR (400 MHz, CDCl$_3$): δ0.58-0.67 (2H, m), 0.98 (6H, dd, J=6.8, 4.0 Hz), 1.56-1.63 (2H, m), 2.10-2.20 (5H, m), 2.26-2.41 (4H, m), 3.09-3.16 (2H, m), 3.56 (9H, s), 4.10-4.15 (4H, m), 5.00 (1H, t, J=5.8 Hz), 6.20 (1H, d, J=5.2 Hz), 6.87 (1H, s), 7.57 (1H, s).

IR (KBr): 720 (CF$_3$), 1227 (CF$_2$, CF$_3$), 1336 and 1524 (NO$_2$), 1746 (C=O) cm$^{-1}$.

[Chemical Formula 19]

Flourine-Containing Compound (1)

-continued

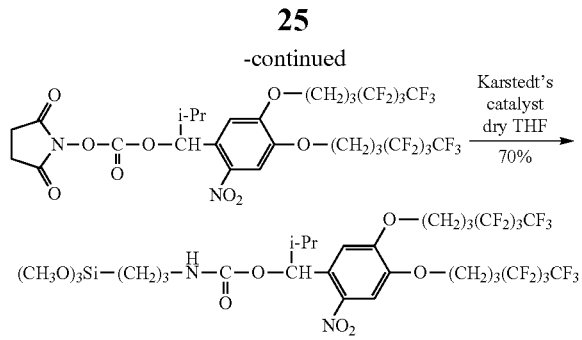

Synthesis Example: Synthesis of Fluorine-Containing Compound (2)

1-(3,4-bis(4,4,5,5,6,6,7,7,8,8,8-undecafluorooctyl)oxy)phenyl)ethanone (Step 1)

1-(3,4-bis(4,4,5,5,6,6,7,7,8,8,8-undecafluorooctyl)oxy)phenyl)ethanone (Compound (I21)) was synthesized according to the step indicated below.

1.11 g (8.03 mmol) of potassium carbonate were weighed out into a 100 mL three-neck recovery flask followed by replacing the inside of the reaction vessel with nitrogen, adding 10 mL of DMF and 0.61 g (4.01 mmol) of 1-(3,4-dihydroxyphenyl) ethanone, and stirring for 10 minutes at room temperature. Subsequently, 4.00 g (8.20 mmol) of 1,1,1,2,2,3,3,4,4,5,5,6,6-tridecafluoro-9-iodononate dissolved in 8 mL of DMF were dropped in followed by stirring for 24 hours at room temperature. Subsequently, the temperature was raised to 60° C. followed by stirring for 1 hour. After distilling off the reaction solution under reduced pressure, 20 mL of purified water, 60 mL of saturated aqueous ammonium chloride solution and 40 mL of 1.2 N hydrochloric acid were added followed by extracting with ethyl acetate (50 mL×6) and washing with saturated sodium chloride solution (40 mL×3). The organic layer was dried with anhydrous sodium sulfate and then filtered, concentrated and vacuum-dried to obtain 3.46 g (3.97 mmol, 99%) of a white solid (Compound (I21)).

Identification of the compound obtained in the aforementioned synthesis (Compound (I21)) is indicated below.

$^1$H-NMR (400 MHz, CDCl$_3$): δ(ppm) 2.10-2.19 (4H, m), 2.26-2.40 (4H, m), 3.05 (3H, s), 4.12 and 4.13 (4H, t, t, J=7.2 Hz), 6.88 (1H, d, J=10.5 Hz), 7.50 (1H, d, J=2.5 Hz), 7.56 (1H, dd, J=2.5, 14.8 Hz).

$^{13}$C-NMR (100 MHz, CDCl$_3$): δ (ppm) 20.63, 26.29, 27.88, 67.35, 111.64, 112.21, 123.69, 130.91, 148.35, 152.74, 196.78.

$^{19}$F-NMR (376 MHz, CDCl$_3$): δ(ppm) −126.29 (4F), −123.53 (4F), −123.01 (4F), −122.04 (4F), −114.62 (4F), −80.92 (6F).

[Chemical Formula 20]

Compound (I21)

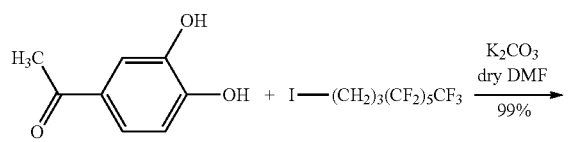

<1-(2-nitro-4,5-bis((4,4,5,5,6,6,7,7,8,8,9,9,9-tridecafluorononyl)oxy)phenyl)ethanone (Step 2)

<1-(2-nitro-4,5-bis((4,4,5,5,6,6,7,7,8,8,9,9,9-tridecafluorononyl)oxy)phenyl)ethanone (Compound (I22)) was synthesized according to the step indicated below.

1.0 g (1.15 mmol) of 1-(3,4-bis((4,4,5,5,6,6,7,7,8,8,9,9,9-tridecafluorononyl)oxy)phenyl)ethanone was placed in a 50 mL recovery flask and dissolved with 3 mL of acetic acid. Moreover, 3 mL of 60% nitric acid dissolved in 2 mL of acetic acid were dropped in followed by raising the temperature to 50° C. and stirring for 4 hours. Subsequently, 100 mL of ice water were added to the reaction vessel followed by extraction with ethyl acetate (50 mL×6) and washing with saturated aqueous sodium bicarbonate solution (50 mL×3). The organic layer was dried with anhydrous sodium sulfate and then filtered and concentrated. The resulting concentrate was isolated and purified by flash column chromatography (hexane:ethyl acetate=5:1 to 0:1) followed by concentration and vacuum-drying to obtain 0.84 g (0.92 mmol, 80%) of a milky white solid (Compound (I22)).

Identification of the compound obtained in the aforementioned synthesis (Compound (I22)) is indicated below.

$^1$H-NMR (400 MHz, CDCl$_3$): δ (ppm) 2.15-221 (4H, m), 2.27-2.39 (4H, m), 2.48 (3H, s), 4.16 and 4.16 (4H, t), 6.64 (1H, s), 7.59 (1H, s).

$^{13}$C-NMR (100 MHz, CDCl$_3$): δ(ppm) 20.46, 27.68, 30.47, 67.80, 108.15, 109.78, 133.16, 138.65, 148.82, 153.29, 199.93.

$^{19}$F-NMR (376 MHz, CDCl$_3$): δ(ppm) −126.28 (4F), −123.52 (4F), −123.01 (4F), −122.3 (4F), −114.64 (4F), −80.84 (6F).

[Chemical Formula 21]

Compound (I22)

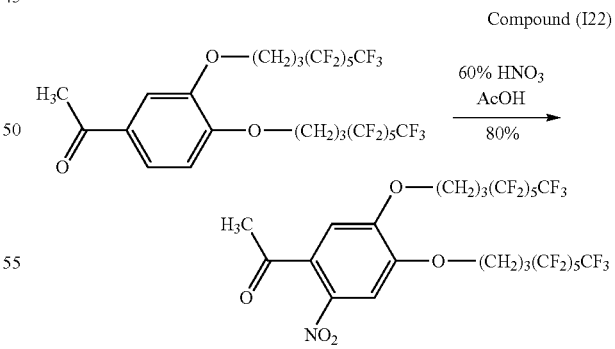

<Synthesis of 1-(2-nitro-4,5-bis((4,4,5,5,6,6,7,7,8,8,9,9,9-tridecafluorononyl)oxy)phenyl)ethanol (Step 3)

1-(2-nitro-4,5-bis((4,4,5,5,6,6,7,7,8,8,9,9,9-tridecafluorononyl)oxy)phenyl)ethanol (Compound (I23)) was synthesized according to the step indicated below.

0.080 g (2.11 mmol) of sodium borohydride, 1 mL of tetrahydrofuran and 1 mL of methanol were placed in a 50 mL recovery flask and stirred for 5 minutes. 0.84 g (0.92 mmol) of 1-(2-nitro-4,5-bis((4,4,5,5,6,6,7,7,8,8,9,9,9-tridecafluoro nonyl)oxy)phenyl) ethanone dissolved in 2 mL of tetrahydrofuran and 2 mL of methanol in a separate vessel were slowly dropped in at 0° C. The temperature was raised to room temperature 15 minutes later followed by stirring for 45 minutes. The reaction solution was concentrated followed by extracting with 5 mL of purified water, 20 mL of saturated aqueous ammonium chloride solution and ethyl acetate (50 mL×4), and the organic layer was dried with anhydrous sodium sulfate and then filtered and concentrated. The resulting concentrate was isolated and purified by flash column chromatography (hexane:ethyl acetate=10:1 to 3:1) followed by concentration and vacuum-drying to obtain 0.40 g (0.43 mmol, 80%) of a yellowish green viscous substance (Compound (I23)).

Identification of the compound obtained in the aforementioned synthesis (Compound (I23)) is indicated below.

$^{1}$H-NMR (400 MHz, CDCl$_{3}$): δ(ppm) 2.12-220 (4H, m), 2.27-2.40 (5H, m), 4.10-4.20 (3H, m), 7.29 (1H, s), 7.55 (1H, s).

$^{13}$C-NMR (100 MHz, CDCl$_{3}$): δ(ppm) 20.05, 24.45, 27.76, 65.81, 67.59, 109.34, 109.84, 137.25, 139.84, 146.96, 153.17.

$^{19}$F-NMR (376 MHz, CDCl$_{3}$): δ(ppm) −126.27 (4F), −123.52 (4F), −123.00 (4F), −122.02 (4F), −114.62 (4F), −80.86 (6F).

[Chemical Formula 22]

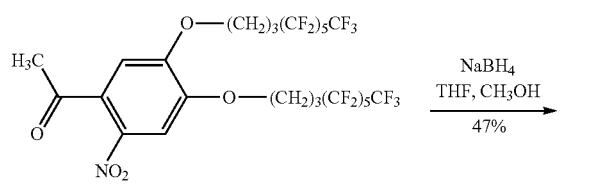

Compound (I23)

[Chemical Formula 23]

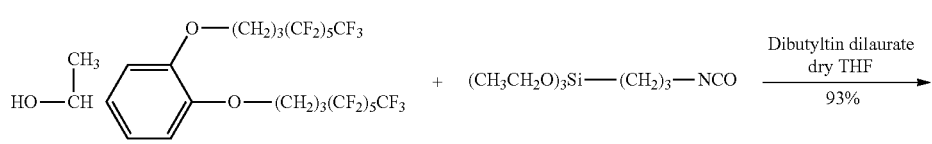

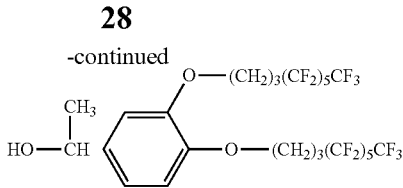

Synthesis of 1-(2-nitro-4,5-bis((4,4,5,5,6,6,7,7,8,8,9,9,9-tridecafluorononyl)phenyl)ethyl(3-(triethoxysilyl)propyl)carbamate (Step 4)

1-(2-nitro-4,5-bis((4,4,5,5,6,6,7,7,8,8,9,9,9-tridecafluorononyl)oxy)phenyl)ethyl(3-(triethoxysilyl)propyl)carbamate (Fluorine-Containing Compound (2)) was synthesized according to the step indicated below.

0.24 g (0.26 mmol) of 1-(2-nitro-4,5-bis((4,4,5,5,6,6,7,7,8,8,9,9,9-tridecafluoro nonyl)oxy)phenyl)ethanol, 3 mL of tetrahydrofuran and 0.17 g (0.71 mmol) of triethoxy(3-isocyanatopropyl)silane were added to a 30 mL recovery flask in the presence of nitrogen followed by additionally dropping in dibutyltin dilaurate dissolved in 2 mL of tetrahydrofuran. After stirring for 30 minutes at room temperature, the reaction solution was heated to reflux and then stirred for 21 hours. The reaction solution was then concentrated and the resulting concentrate was isolated by flash silica gel column chromatography (hexane:ethyl acetate=10:1 to 3:1) followed by concentration and vacuum-drying to obtain 0.29 g (0.25 mmol, 93%) of a pale yellow solid (Fluorine-Containing Compound (2)).

Identification of the compound obtained in the aforementioned synthesis (Fluorine-Containing Compound (2)) is indicated below.

$^{1}$H-NMR (400 MHz, CDCl$_{3}$): δ(ppm) 0.56-0.64 (4H, m), 1.18-1.24 (12H, m), 1.55-1.65 (5H, m), 2.11-2.19 (4H, m), 2.24-2.40 (4H, m), 3.05-3.50 (2H, m), 3.77-3.83 (6H, m), 4.08-4.16 (4H, m), 5.03 (1H, t), 6.33 (1H, q), 6.97 (1H, s), 7.56 (1H, s).

$^{13}$C-NMR (100 MHz, CDCl$_{3}$): δ(ppm) 7.67, 18.13, 20.49, 22.14, 23.20, 27.72, 43.34, 58.42, 67.53, 67.65, 68.55, 109.45, 109.54, 134.63, 140.06, 147.10, 152.95, 155.23.

$^{19}$F-NMR (376 MHz, CDCl$_{3}$): δ(ppm) −126.27 (4F), −123.54 (4F), −123.01 (4F), −122.03 (4F), −114.64 (4F), −80.88 (6F).

Flouride-Containing Compound (2)

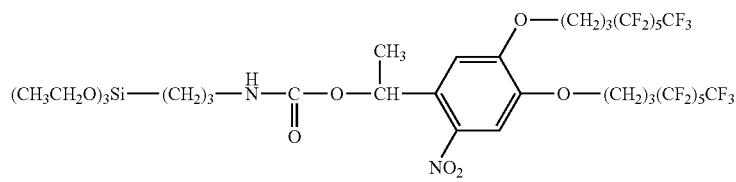

The following indicates the synthesis pathway of 1-(2-nitro-4,5-bis((4,4,5,5,6,6,7,7,8,8,9,9,9-tridecafluorophenyl)oxy)phenyl)ethyl(3-triethoxysilyl)propyl)carbamate (Fluorine-Containing Compound (2)).

[Chemical Formula 24]

(Step 1)
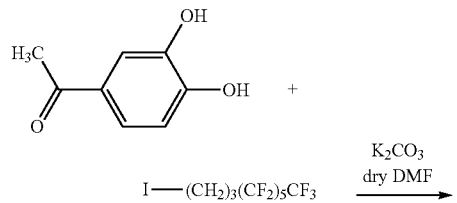

(Step 2)
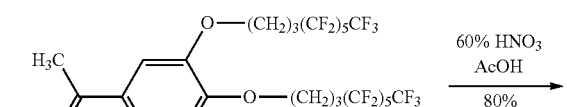

(Step 3)
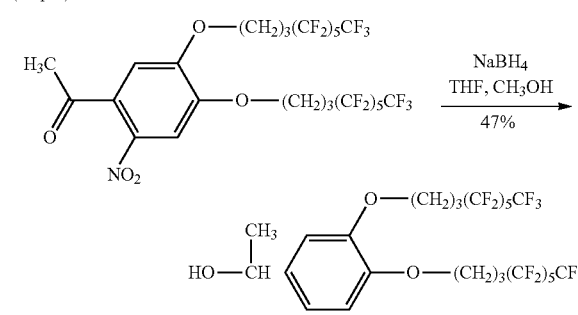

(Step 4)
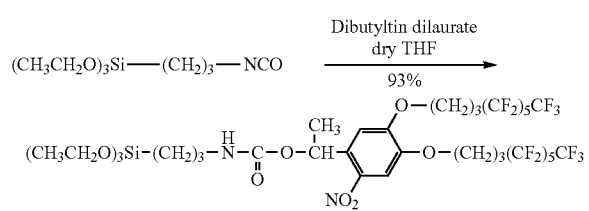

The following Fluorine-Containing Compound (3) was obtained according to the same method as in the aforementioned <<Synthesis Example: Synthesis of Fluorine-Containing Compound (1)>>.

[Chemical Formula 25]

Flouride-Containing Compound (3)
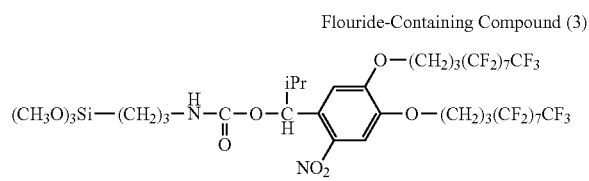

<<Substrate Surface Modification by Fluorine-Containing Compositions>>

Fluorine-Containing Compositions (1) to (3) were prepared using the Fluorine-Containing Compounds (1) to (3) obtained according to the aforementioned synthesis methods, and the surfaces of substrates were modified using these Fluorine-Containing Compositions (1) to (3).

[Preparation of Fluorine-Containing Compositions]

20 mL of 1,3-bis(trifluoromethyl)benzene (to be abbreviated as "HFX") and each of the Fluorine-Containing Compounds (1) to (3) were respectively placed in a 50 mL recovery flask to prepare Fluorine-Containing Compositions (1) to (3) having a concentration of 0.1 mM.

In addition, 20 mL of toluene and each of the Fluorine-Containing Compounds (1) and (3) were respectively placed in a 50 mL recovery flask to prepare Fluorine-Containing Compositions (4) and (5) having a concentration of 0.1 mM.

Fluorine-Containing Compositions (1) to (5) are collectively described in the following Table 1.

TABLE 1

| | Fluorine-Containing Compound | Solvent |
|---|---|---|
| Fluorine-Containing Composition (1) | Fluorine-Containing Compound (1) | HFX |
| Fluorine-Containing Composition (2) | Fluorine-Containing Compound (2) | HFX |
| Fluorine-Containing Composition (3) | Fluorine-Containing Compound (3) | HFX |
| Fluorine-Containing Composition (4) | Fluorine-Containing Compound (1) | Toluene |
| Fluorine-Containing Composition (5) | Fluorine-Containing Compound (3) | Toluene |

[Substrate Pretreatment]

Silicon wafers provided with a thermally-oxidized film were subjected to ultrasonic cleaning for 5 minutes each with methanol, water and acetone, respectively. The substrates were removed followed by drying with a nitrogen stream and pretreating with UV ozone cleaner. Oxygen of the UV ozone cleaner was injected for 3 minutes at a flow rate of 6 L/min, the substrates were irradiated with UV light for 1.5 hours, and the generated ozone was discharged for 10 minutes using a nitrogen stream at a flow rate of 6 L/min.

[Substrate Surface Modification]

The pretreated substrates were respectively immersed in Fluorine-Containing Compositions (1), and (3) to (5) followed by heating to 100° C. in the presence of nitrogen and allowing to stand undisturbed for 24 hours.

The substrates were then removed and washed with methanol followed by subjecting to ultrasonic cleaning (10 minutes) in the methanol. Moreover, the substrates were washed with chloroform and subjected to ultrasonic cleaning (10 minutes) in the chloroform. The surfaces of the substrates were then dried with nitrogen.

Surface modification is thought to have proceeded in the manner described below.

[Chemical Formula 26]

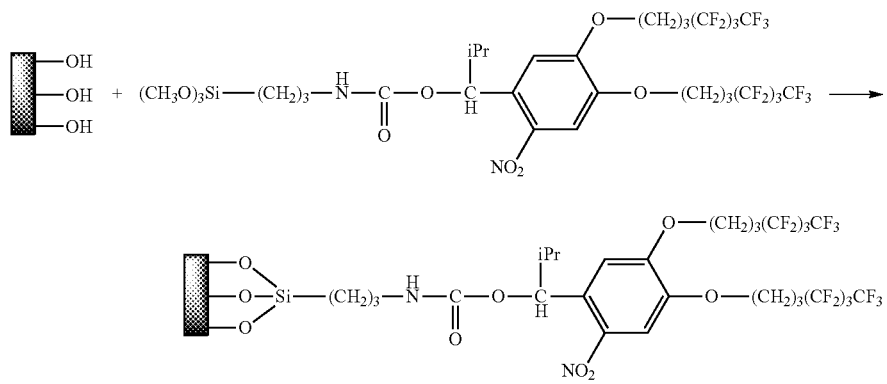

<<Irradiation of Modified Substrates with Light>>

Subsequently, the resulting modified substrates were irradiated with light at an illuminance of 25 mW/cm$^2$ through a copper sulfate filter that cuts out light at a wavelength of 320 nm or less using an ultra-high-pressure mercury lamp in order to investigate photodegradation of the substrates. The irradiated substrates were then rinsed with methanol and chloroform, subjected to ultrasonic cleaning for 5 minutes in chloroform, and then dried with a nitrogen stream.

Photodegradation occurred as indicated by the following formula, and when the substrates were irradiated with light, nitroso compounds were eliminated due to photodegradation of nitrobenzyl groups, thereby enabling the introduction of amino groups onto the substrate surface.

TABLE 2

| | Fluorine-Containing Composition | Contact Angle (°) | | | | Surface Roughness (Ra) |
|---|---|---|---|---|---|---|
| | | θS | θA | θR | θΔ | |
| Ex. 1 | Fluorine-Containing Composition (1) | 102 | 96 | 85 | 11 | 0.16 |
| Ex. 2 | Fluorine-Containing Composition (3) | 108 | 104 | 92 | 12 | 0.13 |
| Comp. Ex. 1 | Fluorine-Containing Composition (4) | 102 | 103 | 81 | 21 | 0.34 |
| Comp. Ex. 2 | Fluorine-Containing Composition (5) | 115 | 100 | 74 | 26 | 1.5 |

[Chemical Formula 27]

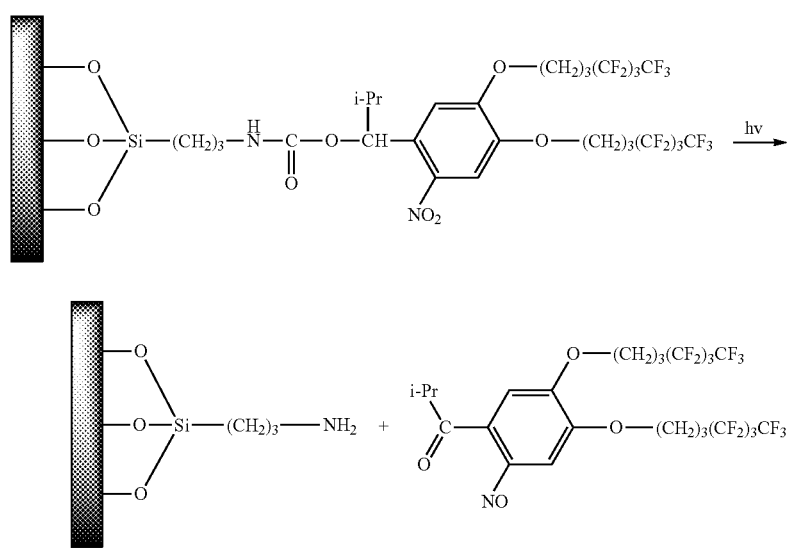

Water contact angle (static ($\theta_S$), advanced contact angle ($\theta A$), receding contact angle ($\theta R$) and wetting hysteresis ($\Delta\theta$) were measured according to the extension/contraction method for the resulting modified substrates. In addition, average surface roughness (Ra) of the resulting modified substrates was measured with an atomic force microscope (AFM). The results are shown in Table 2.

As described in Table 2, the use of Fluorine-Containing Composition (1) or (3) using a fluorine-based solvent (HFX) was found to yield a smoother monolayer than Fluorine-Containing Composition (4) or (5) using toluene for the solvent based on the results for surface roughness (Ra) and the decrease in wetting hysteresis determined from the difference between advanced contact angle and receding contact angle according to the extension/contraction method.

In Comparative Examples 1 and 2, since Fluorine-Containing Compound (1) or (3) having highly water-repellent and oil-repellent fluorinated alkyl groups did not uniformly dissolve in the toluene solution and was present in the form of aggregates, this is the presumed to be the cause of the failure to form a smooth monolayer.

On the other hand, in Examples 1 and 2 that used a fluorine-based solvent, the fluorine-containing compounds having fluorinated alkyl groups were uniformly dispersed in the solvent without aggregating, and this is presumed to have enabled the formation of a smooth monolayer.

Here, in the case of producing a transistor as explained in the aforementioned embodiment, since each layer is produced by laminating in order starting from the substrate, surface roughness attributable to the fluorine-containing composition is reflected in electrodes formed thereon. Although the presence of surface irregularities in an electrode results in the risk of a decrease in transistor performance such as leakage between the gate electrode and source electrode (or drain electrode), a thin film using the fluorine-containing composition of the present embodiment can be preferably used to produce transistors, since it has a low level of surface roughness (Ra) as indicated in Table 2.

<<Monolayer Formation Test>>

Film thickness was determined by analyzing angle resolution by X-ray photoelectron spectroscopy (XPS) and X-ray reflectometry (XRR) in order to confirm the formation of a monolayer for the films formed in Examples 1 and 2. The results are shown in Table 3. Values calculated using ChemBioDraw Ultra 12.0 are shown in the "Calc." column of Table 3.

TABLE 3

| Fluorine-Containing Composition | Film Thickness (nm) | | |
| --- | --- | --- | --- |
| | Calc. | XRR | XPS |
| Example 1 Fluorine-Containing Composition (1) | 2.1 | 1.7 | 2.2 |
| Example 2 Fluorine-Containing Composition (3) | 2.6 | 2.0 | 2.6 |

As shown in Table 3, since film thickness determined by XRR and XPS closely coincided with film thickness calculated using ChemBioDraw Ultra 12.0, a monolayer was found to have been formed in the case of using a fluorine-based solvent.

<<Ink Application Test>>

Three-inch silicon wafers were subjected to ultrasonic cleaning for 5 minutes in methanol, pure water and acetone, respectively. The substrates were removed, followed by drying with a nitrogen stream and pretreating with UV ozone cleaner. The mirrored surfaces of the silicon wafers were irradiated with UV light for 1.5 hours, oxygen of the UV ozone cleaner was injected for 3 minutes at a flow rate of 6 L/min, the substrates were irradiated with UV light for 1.5 hours, and the generated ozone was discharged for 10 minutes using a nitrogen stream at a flow rate of 6 L/min.

Fluorine-Containing Compositions (1) to (3) were prepared in the same manner as previously described, and the pretreated substrates were placed in the separable flasks, heated to 100° C., and immersed for 24 hours. The substrates were then washed with methanol and subjected to ultrasonic cleaning for 10 minutes each in methanol and chloroform followed by drying with a nitrogen stream.

Efficacy of the long-chain fluorinated alkyl groups present in Fluorine-Containing Compositions (1) to (3) was then evaluated using these substrates.

Substrates on which were produced SAM films (consisting of each photosensitive amine-generating layer) formed using Fluorine-Containing Compositions (1) to (3) were irradiated with light having a wavelength of 365 nm and illuminance of 43 mW/cm$^2$ for 46.5 seconds (2 J/cm$^2$) through photomasks having various L/S patterns (L/S=400/400 μm, 200/200 μm, 100/100 μm, 50/50 μm, 30/30 μm, 10/10 μm, 5/5 μm, 3/3 μm). After irradiating with light, the substrates were subjected to ultrasonic cleaning for 3 minutes in chloroform, followed by drying the surfaces thereof with a nitrogen stream.

3 ml of Ag Nanoink (DryCure Ag, Colloidal Ink Co., Ltd.) were deposited on each substrate by spin coating (3000 rpm), followed by drying at room temperature. Pattern formation results were observed with a light microscope since metal wiring is able to be formed preferentially in the exposed region.

In evaluating the efficacy of long-chain fluorinated alkyl groups in Fluorine-Containing Compositions (1) to (3), the same region in each substrate where L/S=50/50 μm was observed, and evaluation criteria were established consisting of the "presence of Ag metal wiring only in the L (line) areas and absence of metal Ag in the S areas that span between the L areas". Those results are shown in Table 4.

In Table 4, "○" indicates that metal Ag wiring is only present in the L (line) areas, S (space) areas are formed so as to span between the L areas, and metal Ag is not present in the S areas.

In Table 4, "Δ" indicates that metal Ag wiring is only present in the L (line) areas, and although S (space) areas are formed so as to span between the L areas, metal Ag is present in a portion of the S areas and portions where patterns are linked were observed.

TABLE 4

| | Pattern Evaluation |
| --- | --- |
| Fluorine-Containing Composition (1) | Δ |
| Fluorine-Containing Composition (2) | ○ |
| Fluorine-Containing Composition (3) | ○ |

As indicated by the above results, a substrate obtained by modifying the surface thereof using the fluorine-containing composition of the present embodiment to form a hydrophilic/water-repellent pattern enables silver ink to be favorably applied thereto.

Moreover, a fluorine-containing composition containing a fluorine-containing compound having long-chain fluorinated alkyl groups was able to more favorably form a pattern. On the basis of this result, the introduction of long-chain fluorinated alkyl groups was determined to serve as a means for demonstrating effective selectivity during material patterning.

BRIEF DESCRIPTION OF THE REFERENCE SYMBOLS

S: Substrate
CONT: Control unit
Sa: Treated surface
2: Substrate supply unit
3: Substrate processing unit
4: Substrate recovery unit 6: Fluorine-containing composition application unit
7: Exposure unit
8: Mask
9: Pattern material application unit
100: Substrate processing device

What is claimed is:

1. A fluorine-containing composition, comprising:
    a fluorine-based solvent, and
    a fluorine-containing compound represented by following Chemical Formula (1):

[Chemical Formula 1]

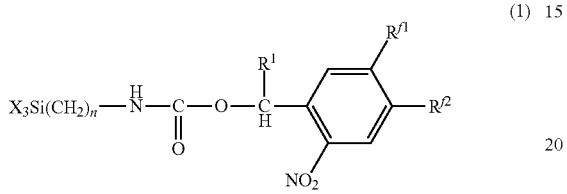

(1)

wherein,
X represents a halogen atom or alkoxy group,
    $R^1$ represents a hydrogen atom or linear, branched or cyclic alkyl group having 1 to 10 carbon atoms,
    $R^{f1}$ and $R^{f2}$ respectively and independently represent a fluorinated alkoxy group, and
    n represents an integer of 0 or more.

2. A substrate for pattern formation having a surface that has been chemically modified using the fluorine-containing composition according to claim 1.

3. A photodegradable coupling agent comprising the fluorine-containing composition according to claim 1.

4. A pattern formation method for forming a pattern on a treated surface of a target material, comprising:
    chemically modifying the treated surface using the fluorine-containing composition according to claim 1,
    forming a latent image consisting of a hydrophilic region and a water-repellent region by exposing the chemically modified treated surface to light, and
    arranging a pattern forming material in the hydrophilic region or water-repellent region.

5. A pattern formation method for forming a circuit pattern for an electronic device on a flexible substrate, comprising:
    chemically modifying an entire surface of the substrate or a specific region thereof using the fluorine-containing composition according to claim 1,
    forming a latent image of the circuit pattern on the substrate utilizing a difference in hydrophilicity and water repellency of the surface of the substrate by exposing the surface of the chemically modified substrate to light, and
    contacting a liquid pattern forming material with a portion of the latent image on the surface of the substrate, thereby capturing the pattern forming material in the shape of the circuit pattern by utilizing the difference in hydrophilicity and water repellency.

6. The pattern formation method according to claim 4, wherein the pattern forming material comprises a liquid electrically conductive material, a liquid semiconductor material, or a liquid insulating material.

7. A pattern formation method for forming a circuit pattern for an electronic device on a prescribed substrate, comprising:
    forming a fluorine-containing composition layer by applying the fluorine-containing composition according to claim 1 to the substrate,
    forming a latent image of the circuit pattern on the substrate by utilizing a difference in hydrophilicity and water repellency by exposing the fluorine-containing composition layer formed on the substrate to light of a prescribed pattern, and
    carrying out electro-less plating by contacting an electro-less plating catalyst with a portion of the latent image.

8. The pattern formation method according to claim 4, wherein the light radiated during exposure to light contains light contained in the wavelength region of 200 nm to 450 nm.

9. A transistor production method for producing a transistor having a gate electrode, a source electrode and a drain electrode, the method comprising:
    forming at least one electrode of the gate electrode, the source electrode and the drain electrode with the pattern formation method according to claim 4.

* * * * *

UNITED STATES PATENT AND TRADEMARK OFFICE
CERTIFICATE OF CORRECTION

PATENT NO. : 10,466,591 B2
APPLICATION NO. : 15/629222
DATED : November 5, 2019
INVENTOR(S) : Yusuke Kawakami et al.

Page 1 of 1

It is certified that error appears in the above-identified patent and that said Letters Patent is hereby corrected as shown below:

In the Claims

Column 35, Line 13 (approx.):
In Claim 1, delete "1]" and insert -- (1)] --, therefor.

Signed and Sealed this
Twenty-fourth Day of December, 2019

Andrei Iancu
*Director of the United States Patent and Trademark Office*